(12) United States Patent
Moon et al.

(10) Patent No.: US 11,864,453 B2
(45) Date of Patent: Jan. 2, 2024

(54) MASK AND METHOD OF MANUFACTURING THE SAME

(71) Applicant: Samsung Display Co., Ltd., Yongin-si (KR)

(72) Inventors: Youngmin Moon, Yongin-si (KR); Minho Moon, Seongnam-si (KR); Ji-Hee Son, Hwaseong-si (KR); Seungyong Song, Suwon-si (KR); Sungsoon Im, Suwon-si (KR); Junho Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/452,279

(22) Filed: Oct. 26, 2021

(65) Prior Publication Data
US 2022/0255049 A1    Aug. 11, 2022

(30) Foreign Application Priority Data

Feb. 5, 2021   (KR) ........................ 10-2021-0016867

(51) Int. Cl.
| | |
|---|---|
| *H01L 51/56* | (2006.01) |
| *C23C 14/04* | (2006.01) |
| *C23C 14/24* | (2006.01) |
| *B23K 26/244* | (2014.01) |
| *B23K 26/364* | (2014.01) |
| *H10K 71/00* | (2023.01) |
| *B23K 26/0622* | (2014.01) |

(52) U.S. Cl.
CPC ........... *H10K 71/00* (2023.02); *B23K 26/244* (2015.10); *B23K 26/364* (2015.10); *C23C 14/042* (2013.01); *C23C 14/24* (2013.01); *B23K 26/0622* (2015.10)

(58) Field of Classification Search
None
See application file for complete search history.

(56) References Cited

U.S. PATENT DOCUMENTS

| | | | |
|---|---|---|---|
| 10,195,838 B2 * | 2/2019 | Saito | ........................ B32B 38/10 |
| 10,787,729 B2 * | 9/2020 | Bai | ........................ C23C 14/042 |
| 10,920,311 B2 * | 2/2021 | Kudo | ...................... B23K 11/11 |
| 11,345,988 B2 * | 5/2022 | Kim | ........................ H10K 50/00 |
| 11,380,546 B2 * | 7/2022 | Ushikusa | ................ C23C 14/12 |
| 11,396,693 B2 * | 7/2022 | Bai | ........................ B05C 21/005 |
| 11,437,578 B2 * | 9/2022 | Obata | .................. H10K 71/166 |

(Continued)

FOREIGN PATENT DOCUMENTS

| | | |
|---|---|---|
| KR | 10-0853544 B1 | 8/2008 |
| KR | 10-2019-0095238 A | 8/2019 |

(Continued)

*Primary Examiner* — Jethro M. Pence
(74) *Attorney, Agent, or Firm* — Lewis Roca Rothgerber Christie LLP

(57) ABSTRACT

Provided is a mask including a mask frame including a base part in which cell openings are defined, and a coating part surrounding edges of the cell openings, covering at least a portion of an upper surface of the base part, and including a materials that is different from that of the base part, and unit masks on the mask frame, respectively corresponding to the cell openings, including a material that is different from that of the coating part, and in which openings are defined.

10 Claims, 23 Drawing Sheets

(56) References Cited

U.S. PATENT DOCUMENTS

| | | | |
|---|---|---|---|
| 11,465,163 B2* | 10/2022 | Jo | C23C 14/042 |
| 2005/0034810 A1* | 2/2005 | Yamazaki | G03F 1/66 |
| | | | 156/345.3 |
| 2008/0018236 A1* | 1/2008 | Arai | C23C 14/042 |
| | | | 445/24 |
| 2009/0170227 A1* | 7/2009 | Yamazaki | G03F 1/66 |
| | | | 438/26 |
| 2015/0368785 A1* | 12/2015 | Nam | C23C 14/042 |
| | | | 118/504 |
| 2016/0260935 A1* | 9/2016 | Lee | C23C 14/042 |
| 2017/0110661 A1* | 4/2017 | Lee | H10K 71/166 |
| 2018/0245199 A1* | 8/2018 | Nam | C23C 14/50 |
| 2019/0316245 A1* | 10/2019 | Nakamura | H10K 71/166 |
| 2019/0352765 A1* | 11/2019 | Ono | C25D 1/10 |
| 2020/0238323 A1 | 7/2020 | Jo et al. | |
| 2020/0392615 A1* | 12/2020 | Bai | C23C 14/24 |

FOREIGN PATENT DOCUMENTS

| | | |
|---|---|---|
| KR | 10-2010002 B1 | 8/2019 |
| KR | 10-2020-0092534 A | 8/2020 |

\* cited by examiner

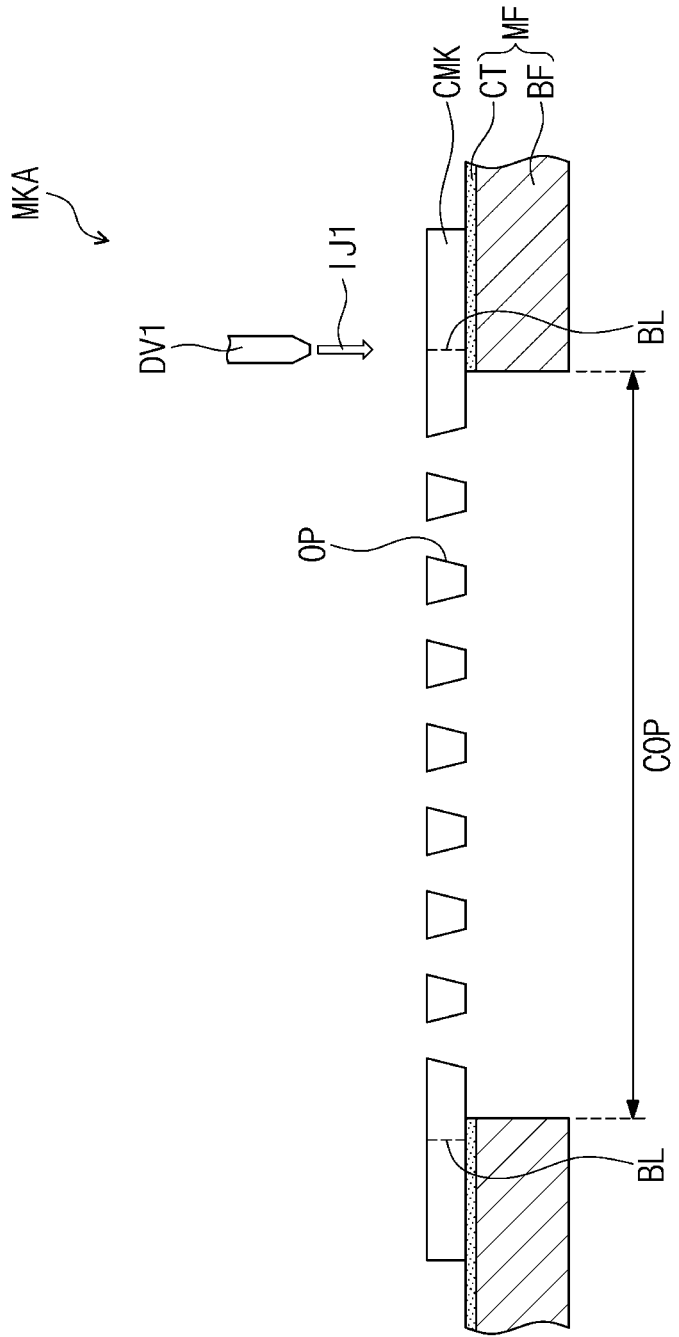

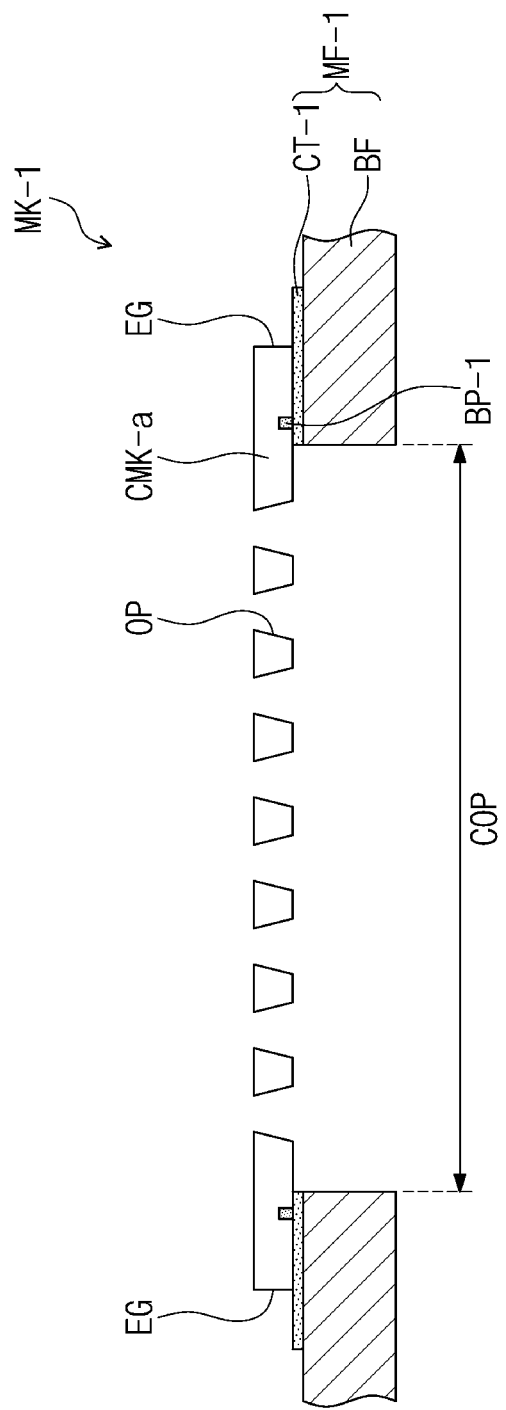

MASK AND METHOD OF MANUFACTURING THE SAME

CROSS-REFERENCE TO RELATED APPLICATION

This application claims priority to, and the benefit of, Korean Patent Application No. 10-2021-0016867, filed on Feb. 5, 2021, the entire contents of which are hereby incorporated by reference.

BACKGROUND

The present disclosure herein relates to a metal mask and a method of manufacturing the same.

A display panel includes a plurality of pixels, each including a driving element such as a transistor, and a display element such as an organic light-emitting diode. The display element may be formed by stacking an electrode and a light-emitting pattern on a substrate.

The light-emitting pattern is formed in a given region by patterning using a mask with penetration portions defined therein. The light-emitting pattern may be formed in a region exposed by the penetration portions. The shape of the light-emitting pattern may be controlled depending on the shape of the penetration portions. Recently, a technology pertaining to an apparatus and a method for manufacturing a large-area mask is being developed to increase the production yield of a display panel including a light-emitting pattern.

SUMMARY

The present disclosure provides a mask used for manufacturing a large-area display panel, and a mask manufacturing method with which reliability is improved and costs may be reduced.

Some embodiments of the present disclosure provide a mask including a mask frame including a base part in which cell openings are defined, and a coating part surrounding edges of the cell openings, covering at least a portion of an upper surface of the base part, and including a materials that is different from that of the base part, and unit masks on the mask frame, respectively corresponding to the cell openings, including a material that is different from that of the coating part, and in which openings are defined.

An absorption rate of the coating part for a laser may be lower than an absorption rate of the base part for the laser.

The coating part may include magnesium or aluminum.

A thickness of the coating part may be at most about ½0 of a thickness of the base part.

The coating part may cover an entirety of the upper surface of the base part.

The coating part may include a plurality of coating parts spaced apart from each other, and respectively surrounding the cell openings.

Edges of each of the unit masks may overlap the coating part on a plane.

The mask may further include a joining part joining one of the unit masks and the mask frame.

The joining part may join the one of the unit masks and the coating part.

The joining part may join the one of the unit masks and the base part, and wherein the coating part is spaced apart from the joining part.

In some embodiments of the present disclosure, a mask includes a mask frame including a base part in which cell openings are defined, and a coating part that covers at least a portion of an upper surface of the base part, and that includes a material that is different from that of the base part, unit masks located to respectively correspond to the cell openings, and in which openings overlapping a respective one of the cell openings are defined, and a joining part joining the unit masks and the mask frame along edges of the cell openings, wherein the coating part overlaps edges of the unit masks on a plane.

The coating part may overlap the joining part on a plane, wherein the joining part joins the unit masks and the coating part.

The coating part may be spaced apart from the joining part on a plane, wherein the joining part joins the unit masks and the base part.

The coating part may include magnesium or aluminum.

In some embodiments of the present disclosure, a mask manufacturing method includes providing a mask frame in which cell openings are defined, and that includes a base part, and a coating part including a material that is different from that of the base part, and covering at least a portion of an upper surface of the base part, providing a cell mask corresponding to one of the cell openings, joining the cell mask and the mask frame by irradiating with a first beam, and removing a portion of the cell mask by irradiating with a second beam to a region overlapping the coating part to form a unit mask, wherein an absorption rate of the coating part for the second beam is lower than an absorption rate of the base part for the second beam.

The second beam may include a pulse laser.

The absorption rate of the coating part for the second beam may be lower than an absorption rate of the cell mask for the second beam.

The coating part may include magnesium or aluminum.

The first beam may be provided to a region overlapping the coating part to join the coating part and the cell mask.

The first beam may be provided to a region not overlapping the coating part to join the base part and the cell mask.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings:

FIGS. 6A to 6F are diagrams illustrating a mask manufacturing method according to some embodiments of the present disclosure;

FIGS. 7A to 7D are cross-sectional views illustrating a mask manufacturing method according to some embodiments of the present disclosure.

DETAILED DESCRIPTION

Figure 1:
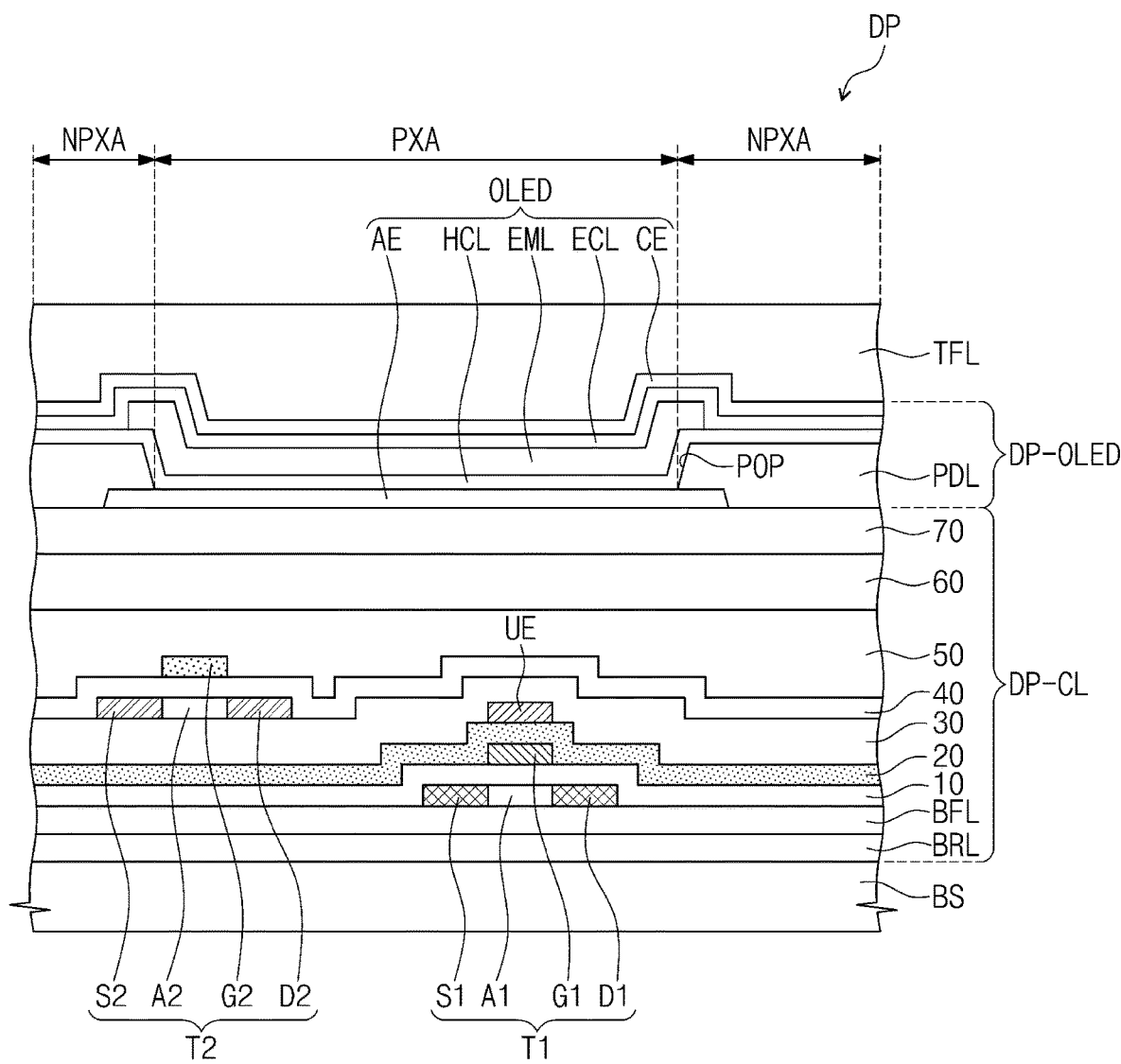
FIG. 1 is a cross-sectional view of a display panel according to some embodiments of the present disclosure.
Figure 1:
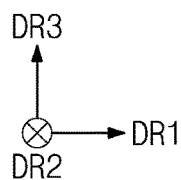

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a cross-sectional view of a display panel according to some embodiments of the present disclosure. In some embodiments, the display panel DP may be a light-emitting display panel. FIG. 1 illustrates a cross-section corresponding to any one of a plurality of pixels. A pixel in the present specification includes at least a transistor and a light-emitting element. FIG. 1 illustrates a region in which two transistors T1 and T2, and a light-emitting element OLED are located in a pixel.

As illustrated in FIG. 1, the display panel DP includes a base layer BS, a circuit element layer DP-CL located on the base layer BS, a display element layer DP-OLED located on the circuit element layer DP-CL, and an insulating layer TFL (hereinafter, defined as an upper insulating layer) located on the display element layer DP-OLED The base layer BS may include a synthetic resin layer. The synthetic resin layer is formed on a supporting substrate used in manufacture of a display panel DP. Then, a conductive layer, an insulating layer, etc. are formed on the synthetic resin layer. When the supporting substrate is removed, the synthetic resin layer corresponds to the base layer BS.

The circuit element layer DP-CL includes at least an insulating layer and a circuit element. The circuit element includes a signal line, a pixel driving circuit, etc. The circuit element layer DP-CL may be formed through a process of forming an insulating layer, a semiconductor layer, and a conductive layer by coating, deposition, etc., and a process of patterning the insulating layer, the semiconductor layer, and the conductive layer by photolithography.

In some embodiments, the circuit element layer DP-CL includes a buffer layer BFL, a barrier layer BRL, and first to seventh insulating layers 10, 20, 30, 40, 50, 60, and 70. The buffer layer BFL, the barrier layer BRL, and the first to seventh insulating layers 10, 20, 30, 40, 50, 60, and 70 may include any one of an inorganic film and an organic film. The buffer layer BFL and the barrier layer BRL may include an inorganic film. At least one of the fifth to seventh insulating layers 50, 60, and 70 may include an organic film.

FIG. 1 illustrates the arrangement relationship of a first active area A1 and a second active area A2, a first gate G1 and a second gate G2, a first source S1 and a second source S2, a first drain D1 and a second drain D2, which collectively respectively constitute a first transistor T1 and a second transistor T2. In some embodiments, the first active area A1, and the second active area A2 may include different materials. The first active area A1 may include a polysilicon semiconductor, and the second active area A2 may include a metal oxide semiconductor. The first source S1 and the first drain D1 are regions of which doping concentrations are higher than that of the first active area A1, and function as an electrode. The second source S2 and the second drain D2 are regions for reducing a metal oxide semiconductor, and function as an electrode.

In some embodiments of the present disclosure, the first active area A1 and the second active area A2 may include the same semiconductor material, and in this case, the stacking structure of the circuit element layer DP-CL may be more simplified.

The display element layer DP-OLED includes a pixel-defining film PDL, and a light-emitting element OLED. The light-emitting element OLED may be an organic light-emitting diode, or a quantum dot light-emitting diode. An anode AE is located on the seventh insulating layer 70. An opening portion POP of the pixel-defining film PDL exposes at least a portion of the anode AE. The opening portion POP of the pixel-defining film PDL may define a light-emitting region PXA. A non-light-emitting region NPXA may surround the light-emitting region PXA.

A hole-controlling layer HCL and an electron-controlling layer ECL are both located on both the light-emitting region PXA and the non-light-emitting region NPXA. A light-emitting layer EML may be provided with a pattern shape to correspond to the opening portion POP. The light-emitting layer EML may be deposited in a way that is different from those of the film-shaped hole-controlling layer HCL and electron-controlling layer ECL. A mask assembly may be used to form the light-emitting layer EML with a corresponding shape (e.g., a predetermined shape).

The hole-controlling layer HCL and the electron-controlling layer ECL may be formed in all of a plurality of pixels by using an open mask. The light-emitting layer EML may be formed differently depending on respective pixels by using a mask which is called a fine metal mask (FMM).

An upper insulating layer TFL may be located on the display element layer DP-OLED. The upper insulating layer TFL may include a plurality of thin films. The plurality of thin films may include an inorganic film and an organic film. The upper insulating layer TFL may include an insulating layer to seal the display element layer DP-OLED, an insulating layer to improve light-emitting efficiency, etc.

Figure 2:
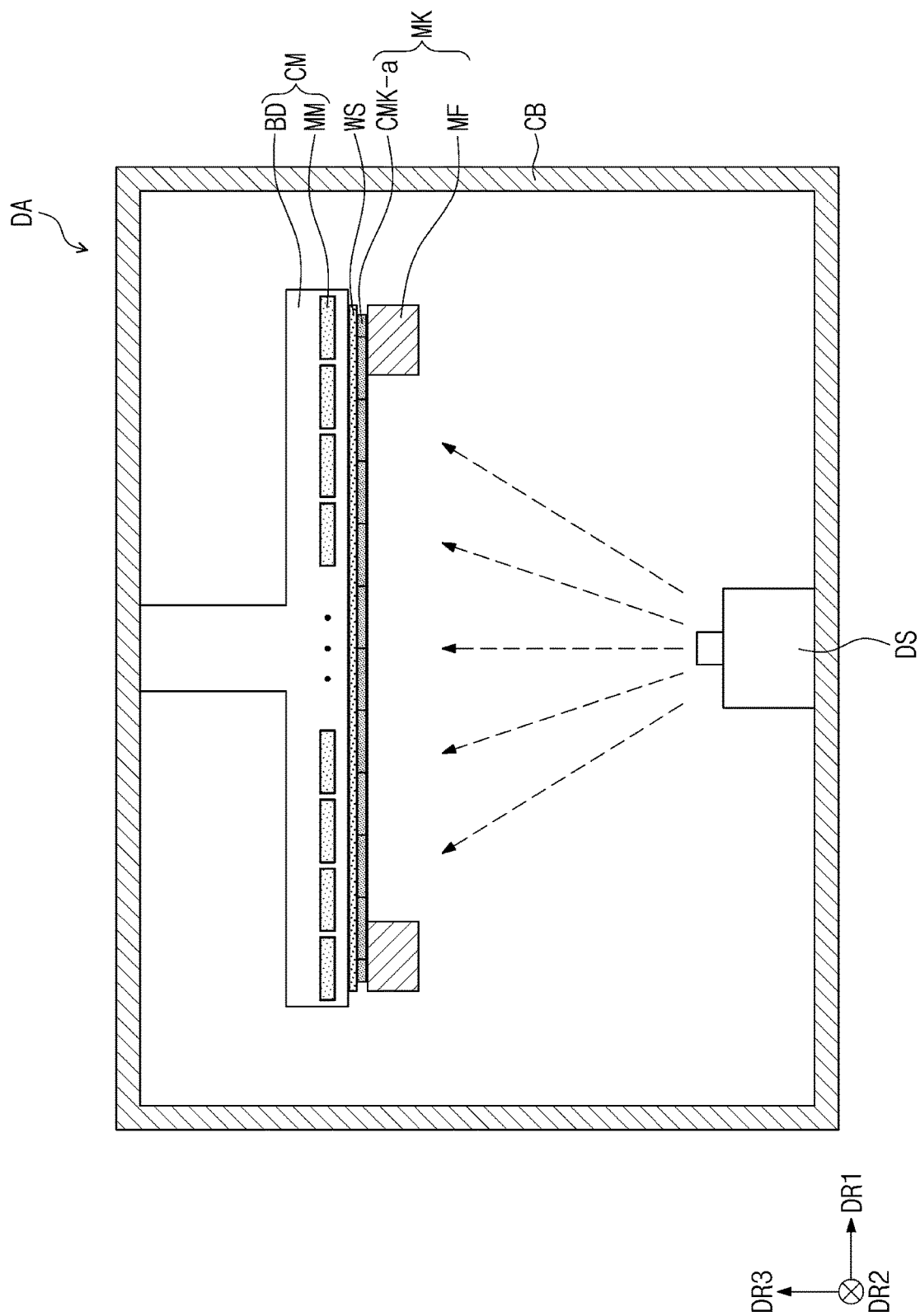
FIG. 2 is a cross-sectional view of a deposition apparatus according to some embodiments of the present disclosure.

FIG. 2 is a cross-sectional view of a deposition apparatus according to some embodiments of the present disclosure. The deposition apparatus DA may be used for a display panel DP in FIG. 1, and, for example, for a process of depositing the light-emitting layer EML.

As illustrated in FIG. 2, the deposition apparatus DA according to some embodiments of the present disclosure includes a deposition chamber CB, a fixing member CM, a deposition source DS located inside the deposition chamber CB, and a mask MK located inside the deposition chamber CB. In some embodiments, the deposition apparatus DA may further include additional machinery to realize an in-line system.

The deposition chamber CB may set a deposition condition to vacuum (e.g., to have low pressure therein). The deposition chamber CB may include a bottom surface, a ceiling surface, and sidewalls. The bottom surface of the deposition chamber CB is substantially parallel to a plane defined by a first directional axis DR1 and a second directional axis DR2. The normal direction of the bottom surface of the deposition chamber CB indicates a third directional axis DR3. Hereinafter, first to third directions are defined as directions respectively indicated by the first to third directional axis DR1, DR2, and DR3, and refer to the same reference numerals. "On a plane," as expressed herebelow, is set on the basis of a plane parallel to a plane defined by the first directional axis DR1 and the second directional axis DR2.

The fixing member CM is located inside the deposition chamber CB and above the chamber source DS, and fixes the mask MK. The fixing member CM may be mounted on the ceiling surface of the deposition chamber CB. The fixing member CM may include a jig or a robot arm that holds the mask MK.

The fixing member CM includes a body portion BD, and magnets MM joined to the body portion BD. The body portion BD may include a plate as a basic structure for fixing the mask MK, but the present disclosure is not limited thereto. The magnets MM may be located inside or outside the body portion BD. The magnets MM may fix the mask MK with a magnetic force.

The deposition source DS may evaporate a deposition material, for example, a light-emitting material, and may emit the deposition material as a deposition vapor. The deposition vapor passes through the mask MK, and is deposited in a pattern (e.g., a predetermined pattern) on a working substrate WS.

The mask MK is located inside the deposition chamber CB and on the deposition source DS, and supports the working substrate WS. The working substrate WS may include a glass substrate or a plastic substrate, for example. The working substrate WS may include a polymer layer located on a base substrate. The base substrate may be removed in a later state of a process for manufacturing a display panel, and the polymer layer may be the base layer BS in FIG. 1.

The mask MK includes a unit mask CMK-a, and a mask frame MF. The unit mask CMK-a may be provided in plural, and may each correspond to a mask for cell-level deposition. The unit mask CMK-a is provided by being joined to the mask frame MF. A detailed description therefor will be described later.

Figure 3A:
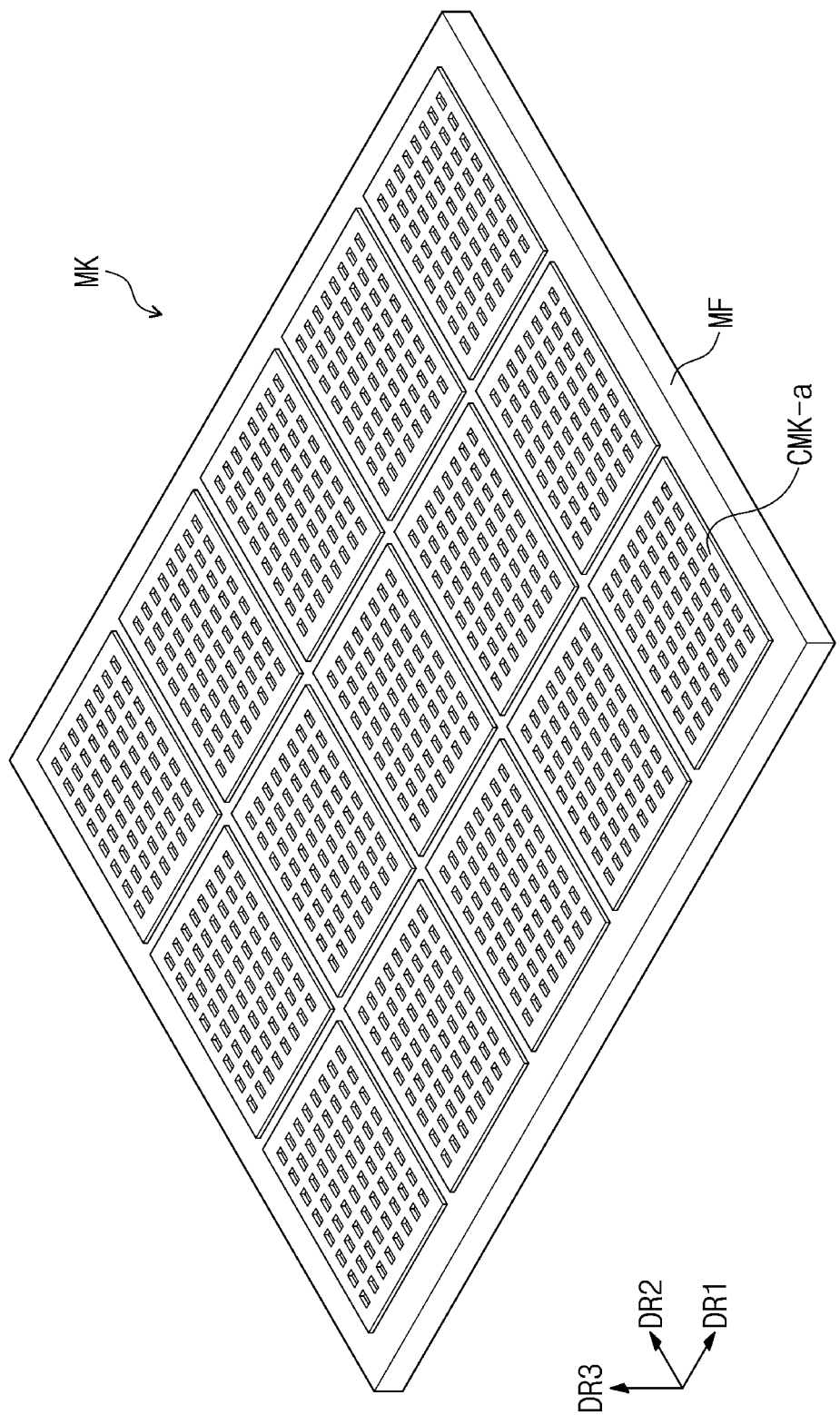
FIGS. 3A to 3B are perspective views of a mask according to some embodiments of the present disclosure.
Figure 3B:
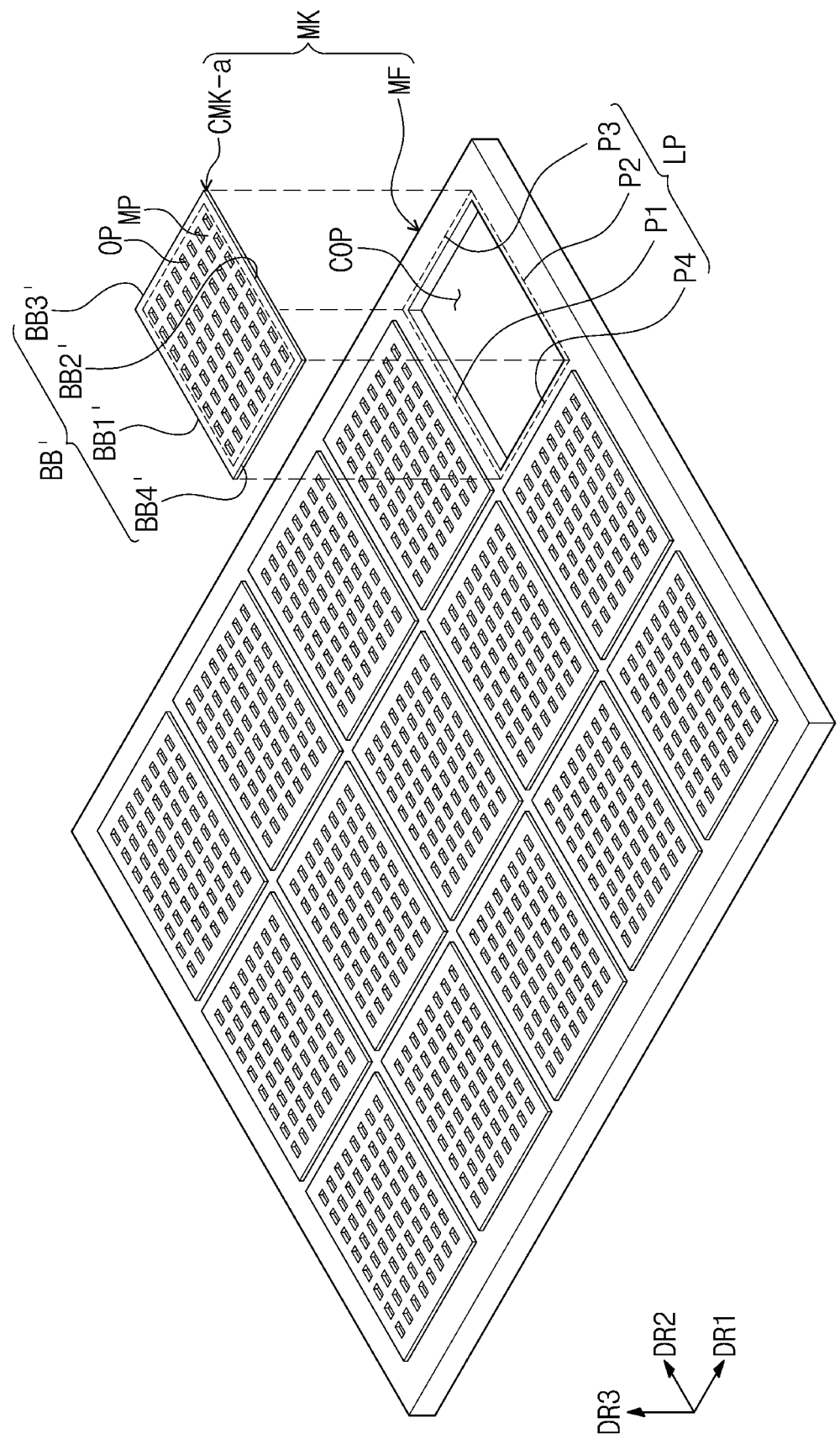

FIGS. 3A and 3B are perspective views of a mask according to some embodiments of the present disclosure. FIG. 3A illustrates a perspective view of a mask MK, and FIG. 3B is a perspective view illustrating a state in which one unit mask CMK-a is separated from a plurality of unit masks. Hereinafter, the present disclosure will be described with reference to FIGS. 3A and 3B.

As illustrated in FIGS. 3A and 3B, the mask MK may include a mask frame MF, and a plurality of unit masks CMK-a. A plurality of cell opening portions COP each penetrating the mask frame MF in the third direction DR3 may be defined in the mask frame MF. The unit masks CMK-a may be located to respectively correspond to the cell opening portions COP. Each of the cell opening portions COP may correspond to one display panel DP. That is, one unit mask CMK-a may be used for a process for depositing one display panel DP, although this is only an example. The mask MK may include a plurality of unit masks CMK-a corresponding to one cell opening portion COP, but the present disclosure is not limited thereto.

Each of the unit masks CMK-a may include a mask body MP, and a bonding part BB'. A plurality of holes OP may be defined in the mask body MP. The holes OP may be defined as penetrating the unit masks CMK-a in the third direction DR3. The bonding part BB' may extend from the mask body MP in the first direction DR1 and the second direction DR2. On a plane, the bonding part BB' may have a rectangular ring shape (e.g., a rectangular closed loop), and may be located along the edge of the mask body MP. The bonding part BB' may include a first bonding part BB1', a second bonding part BB2', a third bonding part BB3', and a fourth bonding part BB4', which are located along the edge of the mask body MP.

The unit masks CMK-a may be located on the mask frame MF. In some embodiments, the unit masks CMK-a may be located on a corresponding cell opening portion COP among a plurality of cell opening portions COP. In some embodiments, an n-th unit mask CMK-a may be located on an n-th cell opening portion COP.

On a plane, the area of the mask body MP of the unit mask CMK-a may be the same as the area of the cell opening portion COP. The bonding part BB' of the unit mask CMK-a may be located on the edge portion LP of the mask frame MF. The edge portion LP may be defined as a portion of the mask frame MF around each of the cell opening portions COP. On a plane, the edge portion LP may have a rectangular ring/loop shape.

The unit mask CMK-a may be fixed to the mask frame MF. For example, the bonding part BB' of the unit mask CML-a may be fixed to the corresponding edge portion LP. For example, a welding process may be performed on sites between a first portion, a second portion, a third portion, and a fourth portion P1, P2, P3, and P4 of the edge portion LP, and respective portions of the corresponding bonding part BB'.

In some embodiments, the edge portion LP may be a bonding region bonded to the corresponding bonding part BB' through a welding process. In some embodiments, a bonding pattern to be bonded to the mask frame MF may be formed on the bonding part BB'.

A bonding pattern to be bonded to the mask frame MF may be formed on each of the first bonding part BB1', the second bonding part BB2', the third bonding part BB3', and the fourth bonding part BB4'. For example, the bonding pattern may have a rectangular ring shape extending in a solid line along the edge of the mask body MP of the unit mask CMK-a. Alternatively, the bonding pattern may be provided in plural in each of the first bonding part BB1', the second bonding part BB2', the third bonding part BB3', and the fourth bonding part BB4' of the unit mask CMK-a, and the plurality of bonding patterns may be spaced apart from each other at intervals (e.g., at predetermined intervals), thereby forming a rectangular ring shape extending in a dotted line along the edge of the mask body MP. Hereinafter, a detailed description about bonding of the mask frame MF and the unit mask CMK-a will be made later.

Figure 4A:
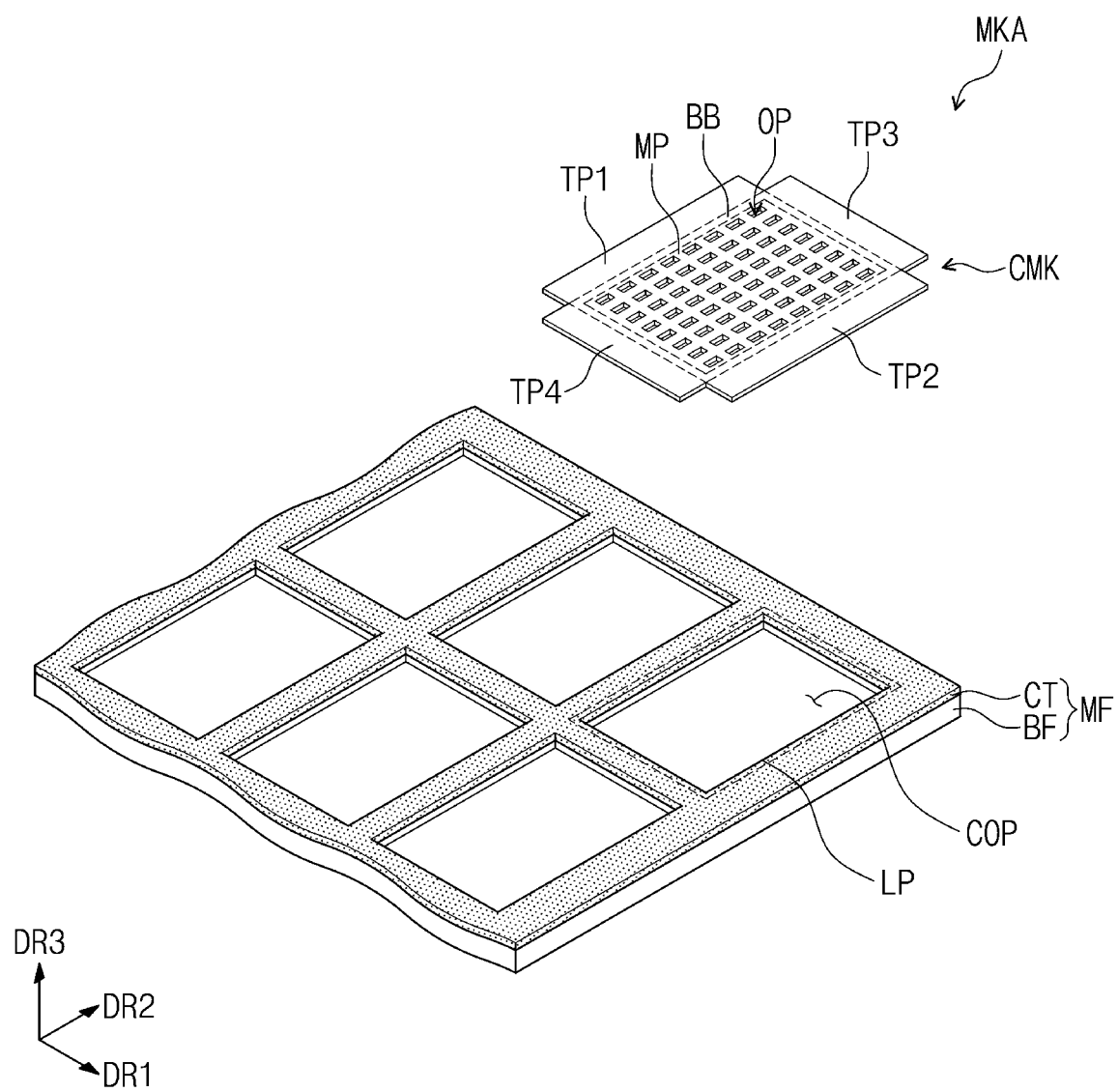
FIG. 4A is a partial perspective view of a mask assembly according to some embodiments of the present disclosure.
Figure 4B:
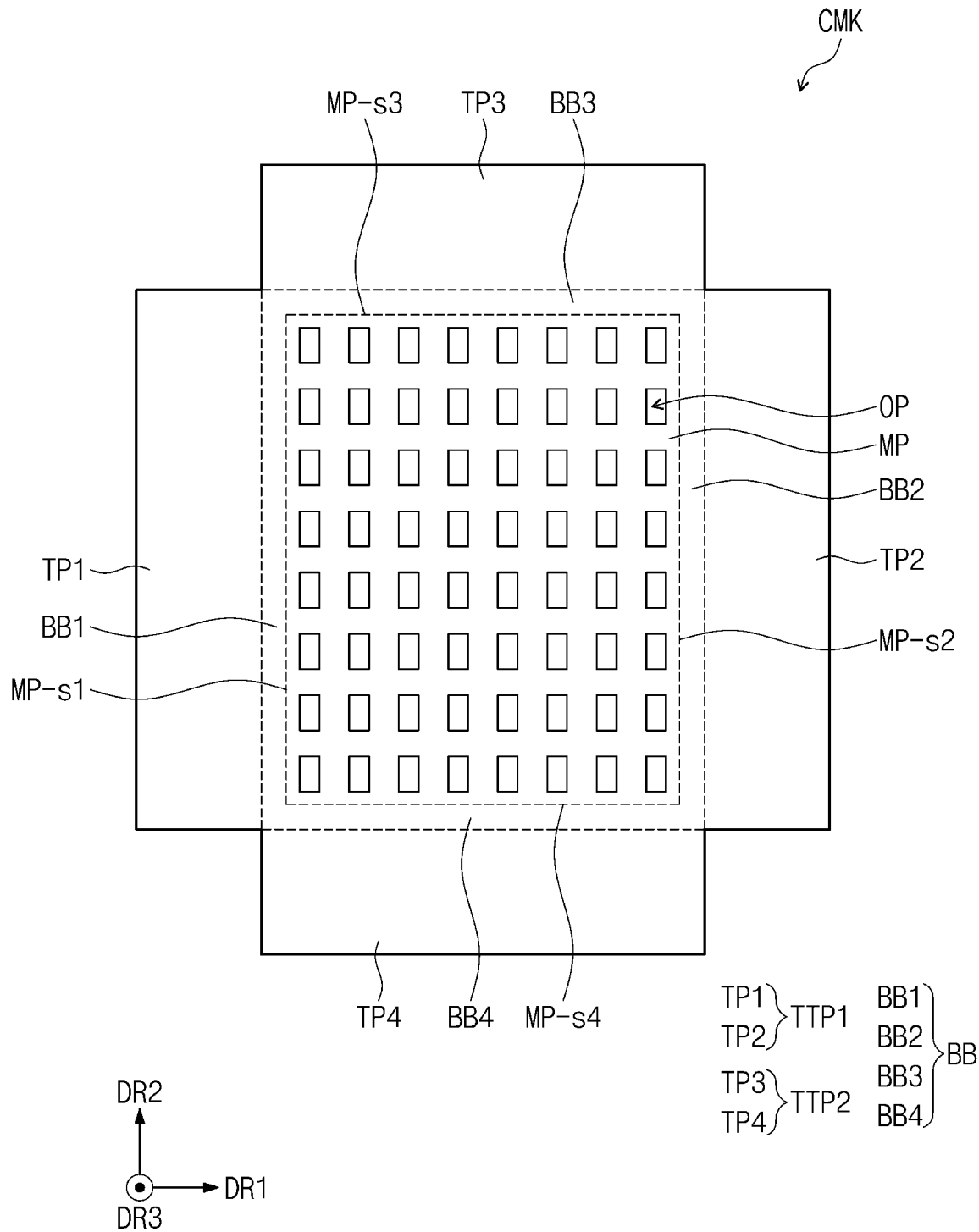
FIG. 4B is a plan view of a cell mask according to some embodiments of the present disclosure.

FIG. 4A is a partial perspective view of a mask assembly according to some embodiments of the present disclosure, and FIG. 4B is a plan view of a cell mask according to some embodiments of the present disclosure. The present disclosure will be described with reference to FIGS. 4A and 4B The mask assembly MKA includes a plurality of cell masks CMK, and the mask frame MF. Each of the cell masks CMK includes a mask body MP, a bonding part BB, and tensioning portions TTP1 and TTP2.

Each of the cell masks CMK may include metal. For example, each of the cell masks CMK may include stainless steel (SUS), an Invar, Ni, Co, etc. However, the material of the cell masks CMK is not limited thereto.

The mask body MP may have a plate shape that is substantially parallel to a plane defined by the first direction DR1 and the second direction DR2. The mask body MP may have a rectangular shape that is substantially parallel to a plane defined by the first direction DR1 and the second direction DR2. The mask body MP may have two long sides, which are spaced apart in the first direction DR1 and extend in the second direction DR2, and two short sides, which are spaced apart in the second direction DR2 and extend in the first direction DR1. The mask body MP may include a first side MP-s1 and a second side MP-s2, which are spaced apart in the first direction DR1 and extend in the second direction DR2, and a third side MP-s3 and a fourth side MP-s4, which are spaced apart in the second direction DR2 and extend in the first direction DR1. The shape of the mask body MP may be a shape corresponding to the plurality of cell openings COP defined in the mask frame MF. A plurality of holes OP may be defined in the mask body MP. The holes OP may be defined by penetrating the unit masks CMK-a in the third direction DR3.

The bonding part BB is located to surround the edge of the mask body MP. The bonding part BB may have a rectangular ring shape, or loop shape, extending in the first direction DR1 and in the second direction DR2. The bonding part BB may be a region joined to the mask frame MF through a welding process, which will be described later.

The bonding part BB may include a first bonding part BB1 located adjacent to the first side MP-s1 of the mask body MP, a second bonding part BB2 located adjacent to the second side MP-s2 of the mask body MP, a third bonding part BB3 located adjacent to the third side MP-s3 of the mask body MP, and a fourth bonding part BB4 located adjacent to the fourth side MP-s4 of the mask body MP.

The tensioning portions TTP1 and TTP2 extend from the bonding part BB, and are spaced apart from the mask body MP, with the bonding part BB located therebetween. The tensioning portions TTP1 and TTP2 may collectively include four tensioning sections located to respectively correspond to four sides of the mask body MP having a rectangular shape. The tensioning portions TTP1 and TTP2 may include a first tensioning portion TTP1 located corresponding to the long sides of the mask body MP, which are spaced apart in the first direction DR1 and extended in the second direction DR2, and a second tensioning portion TTP2 located corresponding to the short sides of the mask body MP, which are spaced apart in the second direction DR2 and extended in the first direction DR1. The first tensioning portion TTP1 may include a first side-tensioning portion TP1 and a second side-tensioning portion TP2, which are located corresponding to the long sides of the mask body MP, and which are opposite to each other with respect to the first direction DR1, and the second tensioning portion TTP2 may include a third side-tensioning portion TP3 and a fourth side-tensioning portion TP4, which are located corresponding to the short sides of the mask body MP, and which are opposite to each other with respect to the second direction DR2. The first side-tensioning portion TP1, the second side-tensioning portion TP2, the third side-tensioning portion TP3, and the fourth side-tensioning portion TP4 may be located to respectively correspond to the four sides of the mask body MP, and may be tensioned in the direction away from the mask body MP.

The mask assembly according to some embodiments includes a plurality of cell unit masks respectively corresponding to a plurality of cell openings, and each of the cell unit masks includes tensioning portions which are located to respectively correspond to the four sides of the mask body.

Unlike the present disclosure, when a large area mask is manufactured through a mask assembly including a cell unit mask in which tensioning portions are located on two sides, the remaining sides on which tensioning portions are not located are contracted in a cell unit mask tensioning process, thereby resulting in degradation in reliability and quality of the.

However, according to some embodiments of the present disclosure, because the mask assembly includes cell unit masks to make it possible to manufacture a large area mask that is applicable to the manufacture of a large area display panel, and the four sides of the mask body MP may be prevented from contracting differently from each other in a cell unit mask tensioning process by using the tensioning portions located to respectively correspond to the four sides of the mask body MP of the cell mask, thereby reducing or preventing degradation in reliability and quality of the mask, and thus making it possible to manufacture a large area display panel having ensured display quality.

The mask frame MF may include a base part BF and a coating part CT. The base part BF may include a metal material such as stainless steel (SUS), an Invar, Ni, or Co. However, the material of the base part BF is not limited thereto. For example, to reduce the weight of the member, the base part BF may also include a polyimide-based material.

The base part BF may have a rectangular shape having long sides extending in the first direction DR1, and short sides extending in the second direction DR2. A plurality of cell opening portions COP may be defined in the mask frame MF. The cell opening portion COP may be arranged to be spaced apart from each other in at least one of the first direction DR1 or the second direction DR2. The cell opening portions COP may have a matrix array in the first direction DR1 and the second direction DR2.

On a plane, each of the cell opening portion COP may have a rectangular shape. For example, the cell opening portion COP may have two long sides spaced apart in the first direction DR1, and extending in the second direction DR2. The cell opening portion COP may have two short sides spaced apart in the second direction DR2, and extending in the first direction DR1. The cell opening portions COP may be defined by penetrating the base part BF in the third direction DR3.

As described above, the cell opening portion COP has a shape corresponding to the display panel DP. For example, the cell opening portion COP may have a shape corresponding to an active region of the display panel DP. Accordingly, the shape of the cell opening portion COP may be designed in various shapes corresponding to the shape of the display panel DP, and is not limited to that in any one embodiment.

A coating part CT may be located on the base part BF, and may cover at least a portion of the upper surface of the base part BF. The coating part CT surrounds the edge of the cell opening portion COP, and does not overlap the cell opening part COP on a plane. The coating part CT may be formed on the upper surface of the base part BF through a deposition process or through a coating process. The coating part CT may be formed of a material that is different from that of the base part BF.

In some embodiments, the coating part CT may include a material with high laser processing selectivity for the base part BF. For example, referring to the table below, when a cell mask CMK is processed (welded, trimmed, etc.) with a laser of about 500 nm, if the base part BF is INVAR® alloy material, the coating part CT may be an aluminum (Al) material having a processing selectivity for an Invar.

TABLE 1

| Material | Reflectance/Absorption rate(@ About 515 nm laser) |
|---|---|
| Iron (Fe) | 51.0%/49.0% (n = 2.8312, k = 2.9028) |
| Nickel (Ni) | 62.2%/37.8% (n = 1.8428, k = 3.3792) |
| Cobalt (Co) | 64.6%/35.4% (n = 1.9484, k = 3.6488) |
| Aluminum (Al) | 91.8%/8.2% (n = 0.86754, k = 6.2231) |
| Magnesium (Mg) | 95.2%/4.8% (n = 0.28147, k = 4.6839) |

Table 1 shows the reflectance and the absorption rate of each material for a laser having a wavelength of about 515 nm. Then, n may be a refractive index, and k may be an extinction coefficient. Referring to Table 1, it may be seen that for a laser having a wavelength of about 515 nm, the absorption rate of aluminum or magnesium is significantly lower than the absorption rate of iron or nickel that forms an Invar. Similarly, it may be seen that, for a laser having a wavelength of about 515 nm, the reflectance of aluminum or magnesium is significantly higher than the reflectance of iron or nickel that forms an INVAR® alloy.

In other words, the coating part CT may include, for a laser having the same wavelength, a material having a relatively low laser absorption rate or a relatively high laser reflectance, as compared to the base part BF. Accordingly, because the upper surface of the base part BF is covered with the coating part CT, damage to the base part BF, which may otherwise occur when the base part is irradiated with a laser for processing the cell mask CMK, may be reduced or prevented.

In addition, the coating part CT may include, for a laser having the same wavelength, a material having a relatively low laser absorption rate or a relatively high laser reflectance, as compared to the cell mask CMK. Accordingly, the cell mask CMK may be easily processed, and the base part BF may be stably protected. Therefore, the reliability of the mask frames MF, MF-1, and MF-2 may be improved during a mask manufacturing process.

Meanwhile, in some embodiments, the coating part CT may have a thickness that is, at most, about 1/20 of the thickness of the base part BF. When the thickness of the coating part CT is too great, pixel position accuracy (PPA) may be damaged due to the coefficient of thermal expansion (CTE) thereof in a deposition process using a mask, such that deposition accuracy may be degraded. Meanwhile, and for example, the coating part CT may have a thickness of, at least, about 10 nm. When the thickness of the coating part CT is too small, a function to protect the base part BF may be lost.

According to the present disclosure, because the coating part CT is provided to have a thickness that is suitable for not only protecting the base part BF, but also for not degrading a mask deposition accuracy during a process for processing with a laser, it is thereby possible to improve the process reliability and accuracy of a mask. However, this is illustrated as an example, and in consideration of a coefficient of thermal expansion or laser absorption rate, the coating part CT may be designed to have various thicknesses in a range in which the base part BF is protected and deposition accuracy is not degraded. However, the present disclosure is not limited thereto.

Figure 5A:
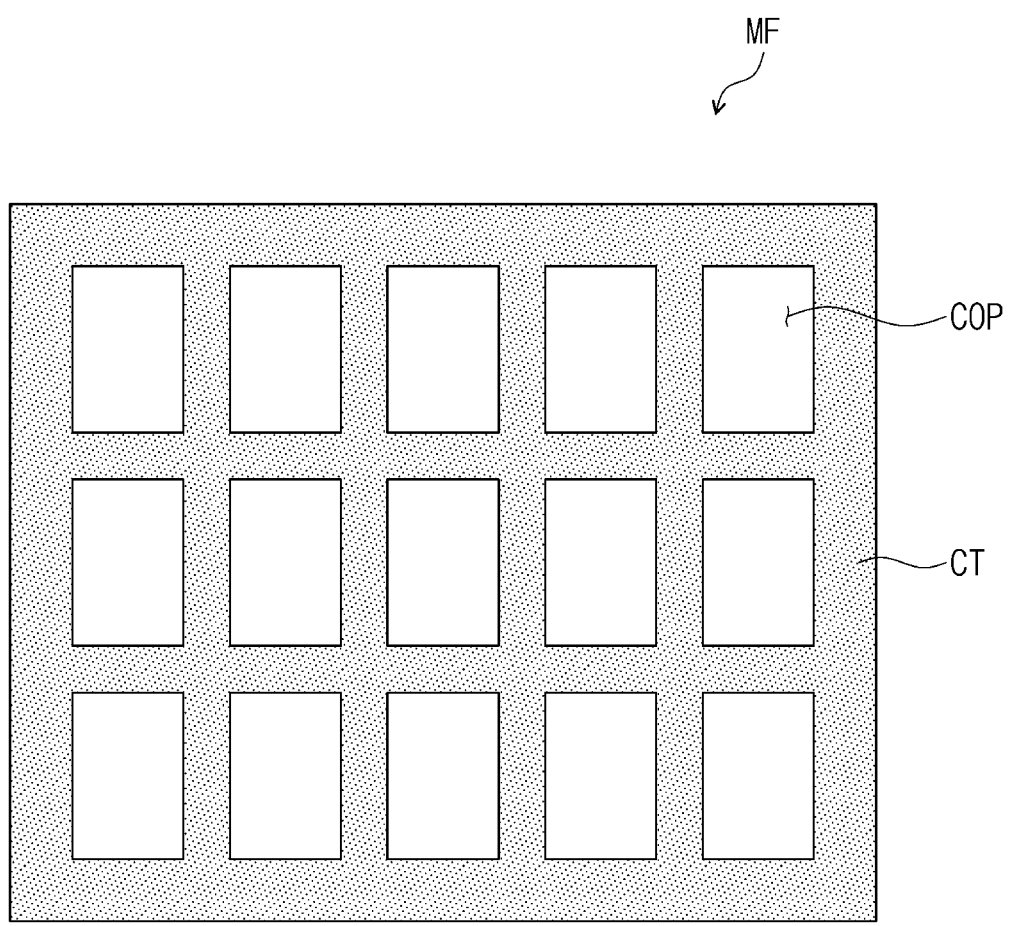
FIGS. 5A to 5C are plan views of a mask frame according to some embodiments of the present disclosure.
Figure 5B:
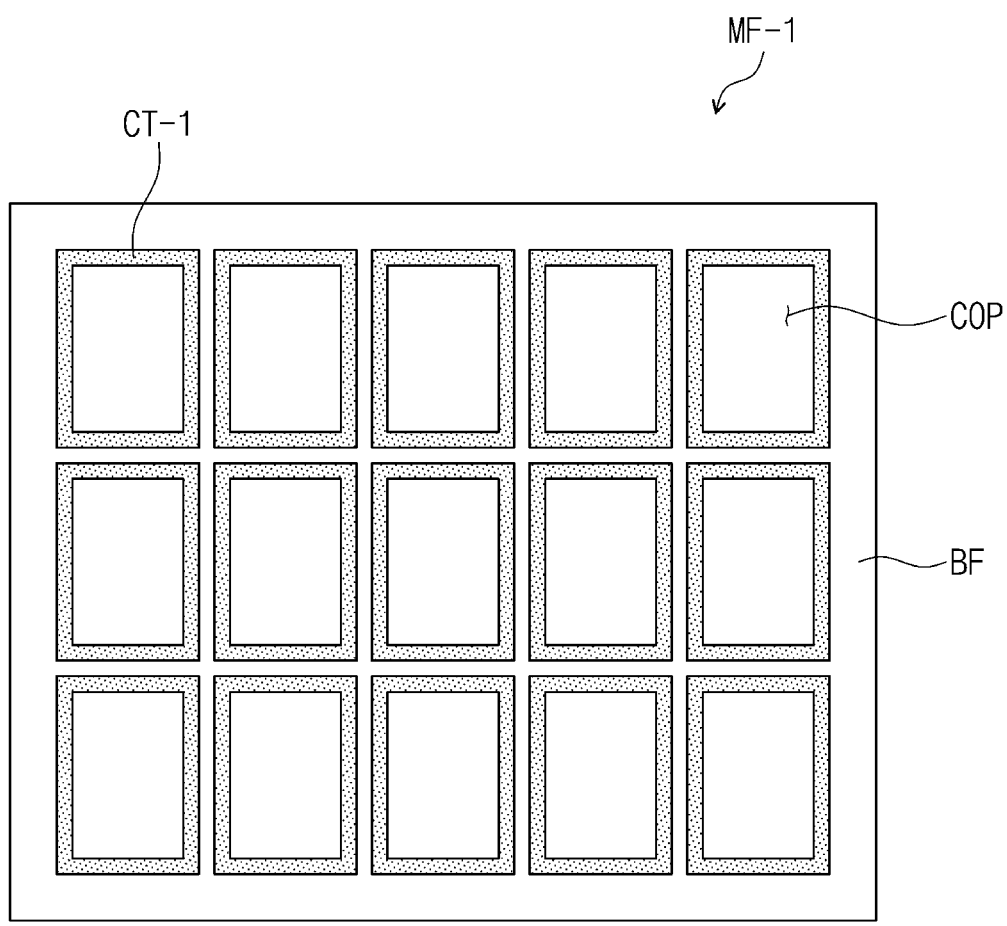
Figure 5C:
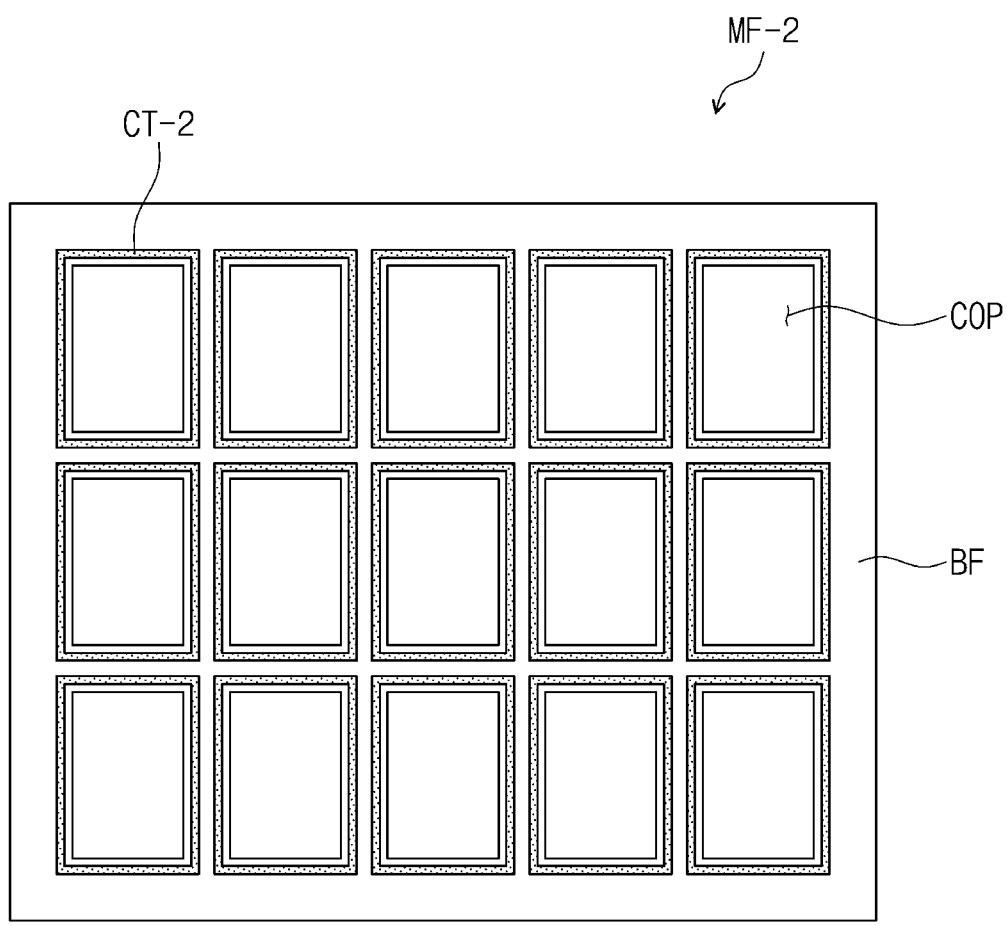

FIGS. 5A to 5C are plan views of a mask frame according to some embodiments of the present disclosure. The present disclosure will be described with reference to FIGS. 5A to 5C.

As illustrated in FIGS. 5A to 5C, the mask frame MF may include a base part BF, and a coating part CT, CT-1 or CT-2. As described above, a plurality of cell opening portions COP spaced apart from each other are defined in the mask frame MF. The coating part CT, CT-1 or CT-2 may be provided to have various shapes as long as the coating part is capable of protecting the base part BF.

For example, as illustrated in FIG. 5A, the coating part CT may cover the entire upper surface of the base part BF. Accordingly, the coating part CT may have a shape in which opening portions corresponding to the cell opening portions COP are defined. The coating part CT may have an integrated shape. Therefore, although a laser for processing the cell mask CMK may be provided to any region on the base part BF, the base part BF may be stably protected.

Alternatively, as illustrated in FIG. 5B, the mask frame MF may include a plurality of coating parts CT-1 spaced apart from each other. The coating parts CT-1 may be located to respectively correspond to the cell opening portion COP. The coating parts CT-1 cover a portion of the upper surface of the base part BF, and expose the remainder of the base part BF. Each of the coating parts CT-1 may have a shape corresponding to the edge portion LP. Each of the coating parts CT-1 may have a rectangular ring shape respectively surrounding the cell opening portions COP. According to the present disclosure, the coating parts CT-1 may be selectively formed on a region(s) of the base part BF that may be irradiated with a laser, thereby reducing process costs.

Alternatively, as illustrated in FIG. 5C, the mask frame MF-2 may include a plurality of coating parts CT-2. The coating parts CT-2 may be located to respectively correspond to the cell opening portions COP, and may have a shape exposing a portion of the edge portion LP (e.g., exposing a portion of the base part BF at an interior of a coating part CT-2). For example, each of the coating parts CT-2 may have a relatively small width compared to each of the coating parts CT-1. The coating parts CT-2 are provided to not overlap a region in which a welding process, which is to be described later, is performed. Accordingly, the cell mask CMK and the mask frame MF are directly joined. A detailed description therefor will be described later.

FIGS. 6A to 6F are diagrams illustrating a mask manufacturing method according to some embodiments of the present disclosure. The present disclosure will be described with reference to FIGS. 6A to 6F.

As illustrated in FIGS. 6A to 6F, the cell mask CMK with four surfaces tensioned are provided on the mask frame MF. That is, before arranging a plurality of cell masks CMK on the mask frame MF, the method may include tensioning each of the cell masks CMK. For example, the cell mask CMK may be tensioned by causing a clamper, etc., included in a tensioning apparatus for grasping tensioning portions TTP1 and TTP2 included in the cell mask CMK, and by pulling the tensioning portions TTP1 and TTP2 in a direction away from the mask body MP.

For example, the cell mask CMK may receive a first tensile force TS1 in a direction in which the first side MP-s1 and the second side MP-s2 of the mask body MP are opposite of each other, that is, in the first direction DR1, and may receive a second tensile force TS2 in a direction in which the third side MP-s3 and the fourth side MP-s4 of the mask body MP are opposite of each other, that is, in the second direction DR2. The cell mask CMK may be tensioned through a tensioning process in such a way that each of the mask body MP and the bonding part BB of each of a plurality of cell masks CMK respectively corresponds to the corresponding cell opening portions COP and the corresponding edge portions LP. Each of the cell mask CMK may be tensioned in four directions by virtue of the tensioning portions TTP1 and TTP2 respectively arranged on the four sides of the mask body MP, and may thus be tensioned to correspond to the shape of the respective cell opening portions COP without contracting the four sides thereof.

Then, as illustrated in FIG. 6C, the cell mask CMK is joined to the mask frame MF by using a bonding machine DV1. The bonding machine DV1 may be a welding machine or a laser oscillator. The bonding machine DV1 provides the cell mask CMK with a first beam IJ1 along a joining line BL defined on the cell mask CMK. The joining line BL is defined on the bonding part BB. The joining line BL may be defined on a position that is spaced apart from the cell opening portion COP, and that overlaps the mask frame MF.

Figure 6A:
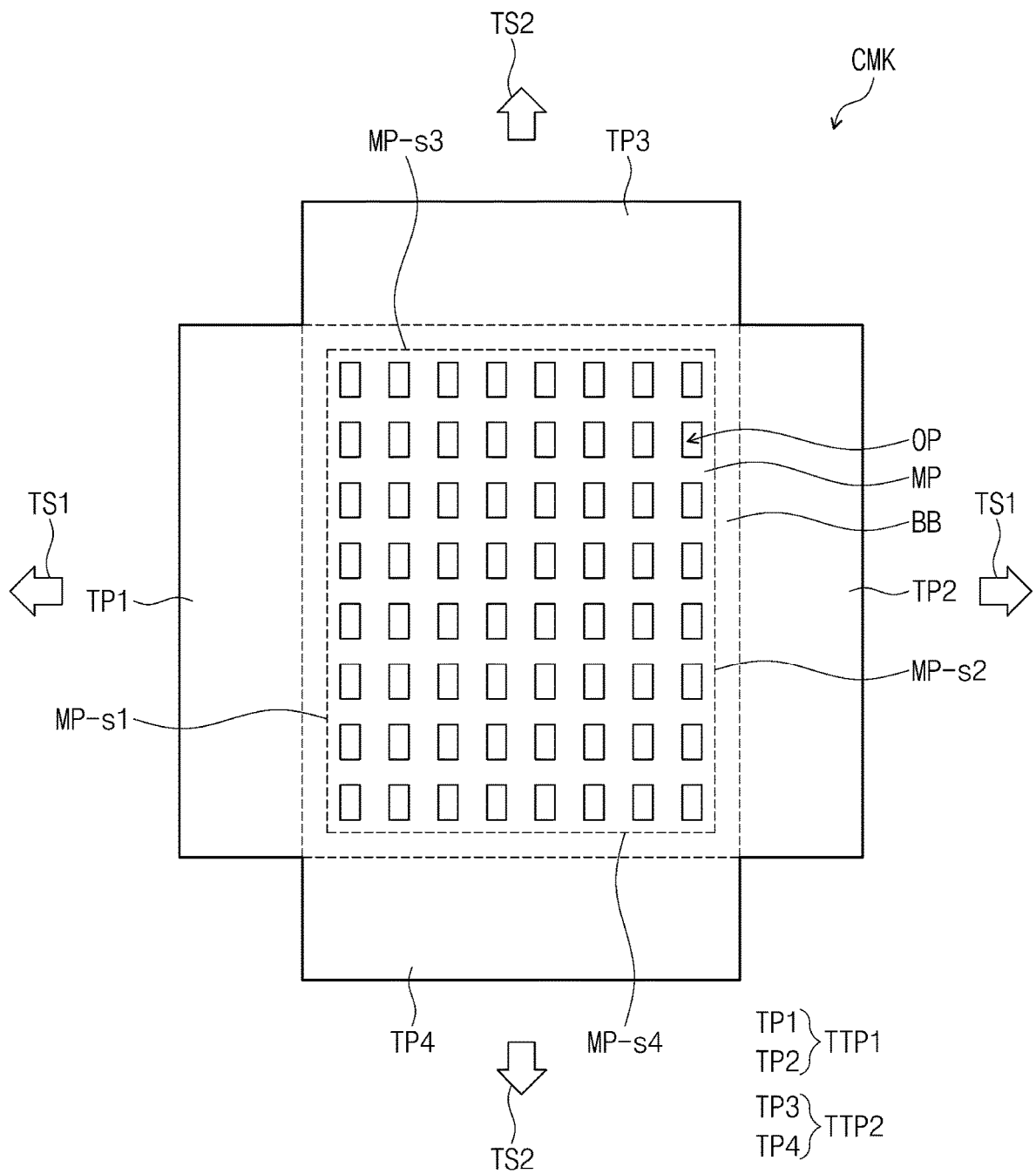
Figure 6B:
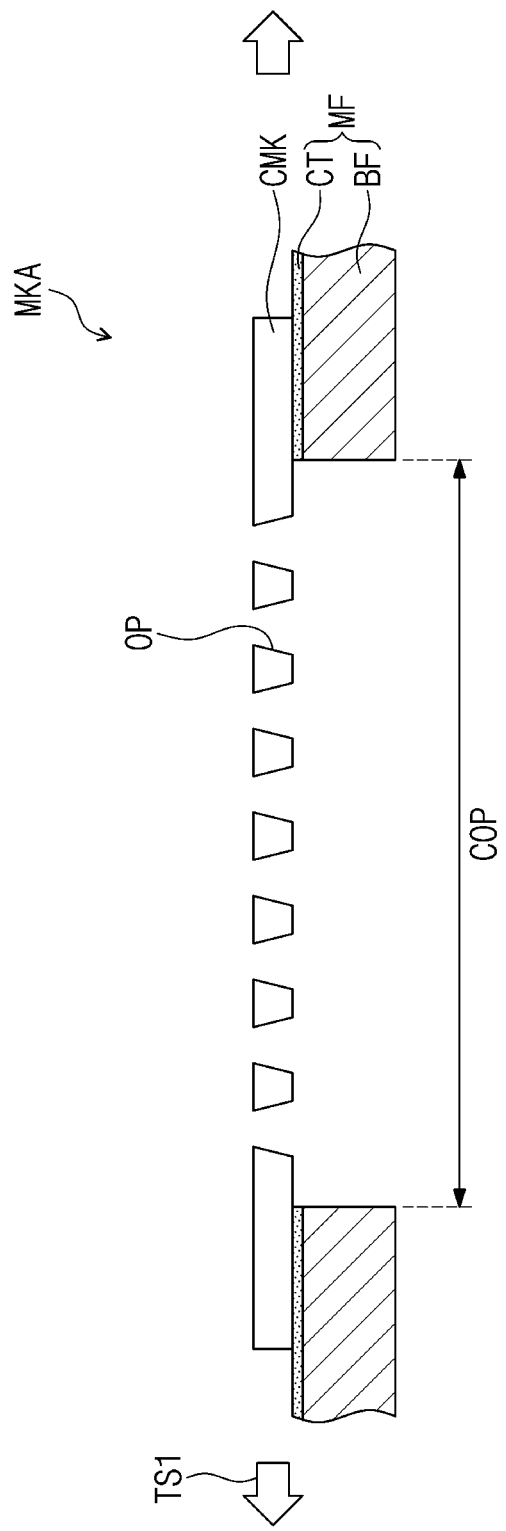
Figure 6D:
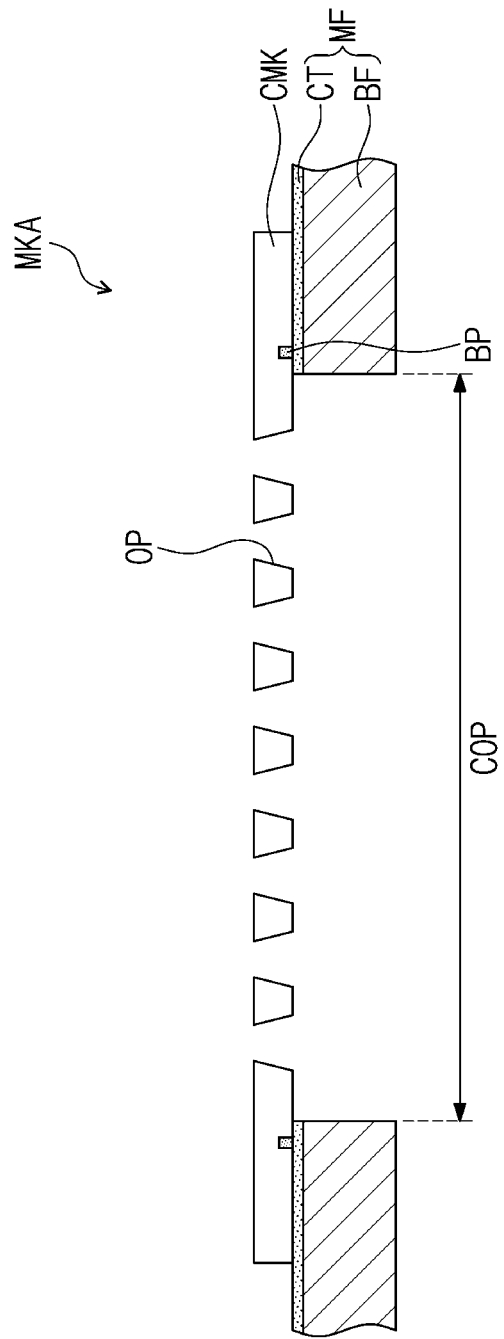

Then, as illustrated in FIG. 6D, a joining part BP, which joins the cell mask CMK and the mask frame MF, may be formed. The joining part BP may be formed by melting a portion of the cell mask CMK, or by oxidizing a portion of the cell mask CMK, and may further include a portion of the coating part CT. For example, the joining part BP may include a metal oxide, and the metal may be a material also found in the cell mask CMK.

In some embodiments, the joining part BP may contact the coating part CT, and may be spaced apart from the base part BF. The base part BF is covered with the coating part CT, and therefore is not exposed to the first beam IJ1 emitted from the bonding machine DV1. Therefore, damage caused to the base part BF by the first beam IJ1 may be reduced or prevented.

Figure 6E:
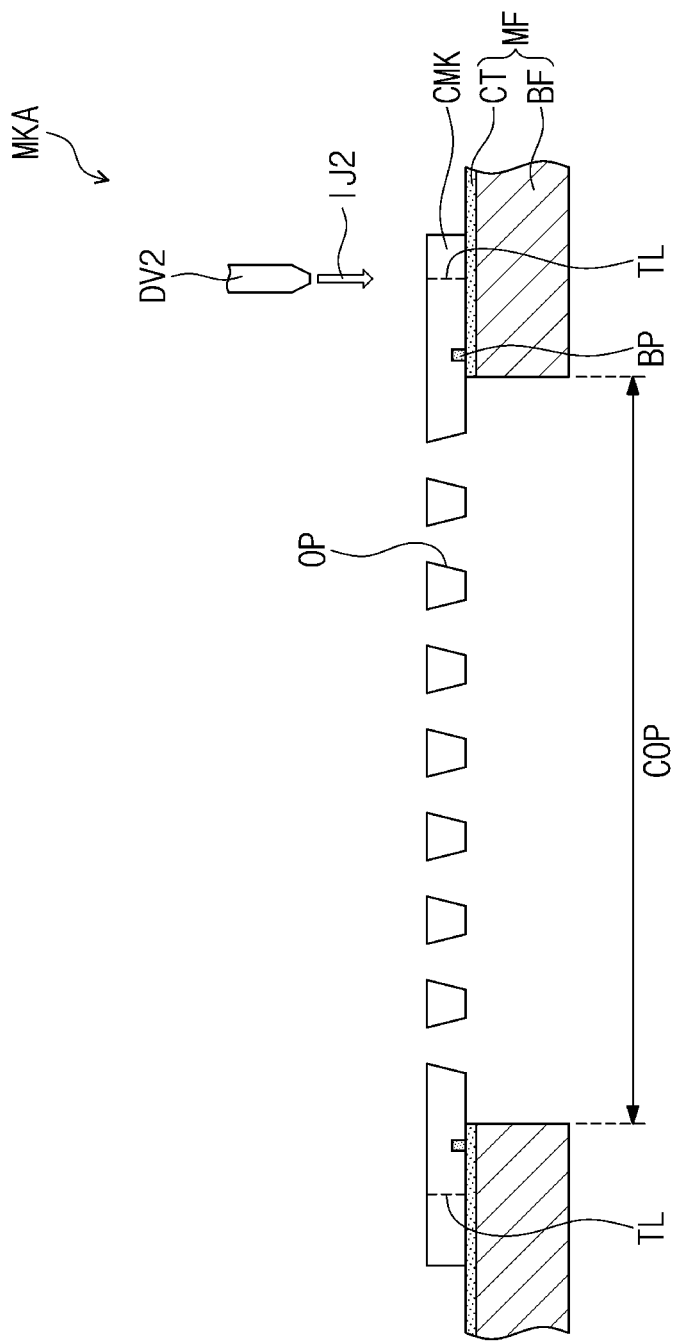
Figure 6F:
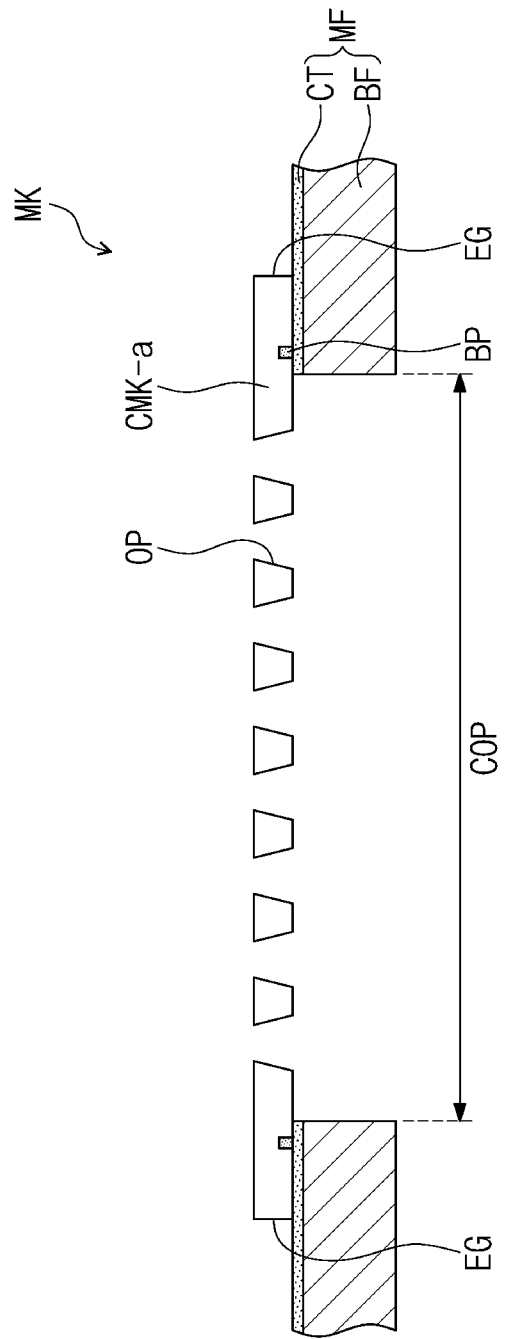

Then, as illustrated in FIGS. 6E and 6F, a mask MK is formed by trimming the cell mask CMK. A trimmer DV2 is provided over the mask assembly MKA, and may cut the cell mask CMK with a second beam IJ2 by irradiating the cell mask CMK along a trimming line TL defined on the cell mask CMK. Accordingly, the cell mask CMK may be formed into a unit mask CMK-a having an edge EG.

When the trimmer DV2 may remove a portion of the cell mask CMK, various embodiments may be included. For example, the trimmer DV2 may include various embodiments such as a heat irradiator, a light irradiator, and a laser oscillator. In some embodiments, the trimmer DV2 may be a pulsed laser oscillator, and may include a pulsed laser oscillator in various units, for example, in units of nanosecond, picosecond, or femtosecond. Accordingly, the second beam IJ2 may be a pulsed laser beam.

The coating part CT has higher reflectance and lower absorption rate for the second beam IJ2 than the base part BF and the cell mask CMK. For example, when the second beam IJ2 is a laser beam of about 500 nm and the base part BF and the cell mask CMK are made of an INVAR® material (INVAR is a registered trademark of Aperam Alloys IMPHY Joint Stock Company), the material of the coating part CT may be aluminum or magnesium having a relatively low absorption rate for the second beam IJ2. Accordingly, while the second beam IJ2 processes the cell mask CMK, the coating part CT might not be damaged. In addition, although the second beam may be irradiated excessively, the base part BF may protect by the coating part CT, thereby reducing or preventing damage caused by the second beam IJ2.

According to the present disclosure, the mask frame MF includes the coating part CT, making it possible to prevent the base part BF from being damaged. Accordingly, the processing reliability may be improved during a process for manufacturing a mask MK.

FIGS. 7A to 7D are cross-sections illustrating a mask manufacturing method according to some embodiments of the present disclosure. FIGS. 7A to 7D illustrate regions corresponding to those in FIGS. 6B to 6F. Hereinafter, the present disclosure will be described with reference to FIGS. 7A to 7D. Meanwhile, like reference numerals are given to like elements as those described in FIGS. 1 to 6F, and duplicate descriptions thereof may be omitted herein.

Figure 7A:
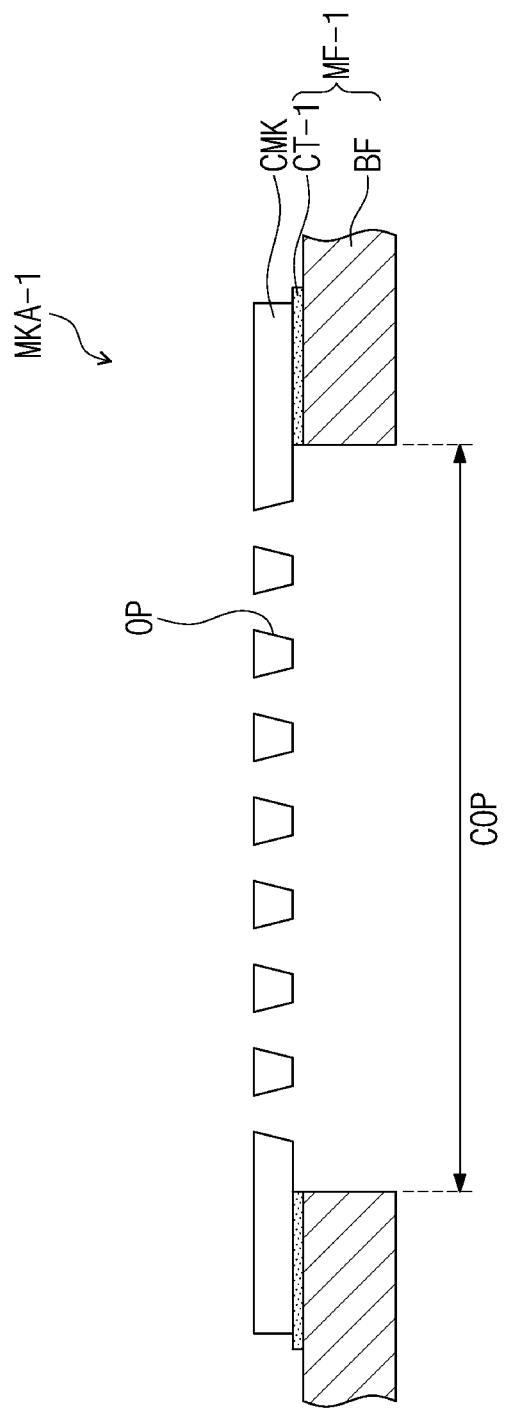

As illustrated in FIG. 7A, a mask assembly MKA-1 may include a mask frame MF-1 and a cell mask CMK. The mask frame MF-1 may correspond to the mask frame MF-1 illustrated in FIG. 5B. In addition, FIG. 7A may be a process corresponding to FIG. 6B, and a tensioning process may be omitted.

Figure 7B:
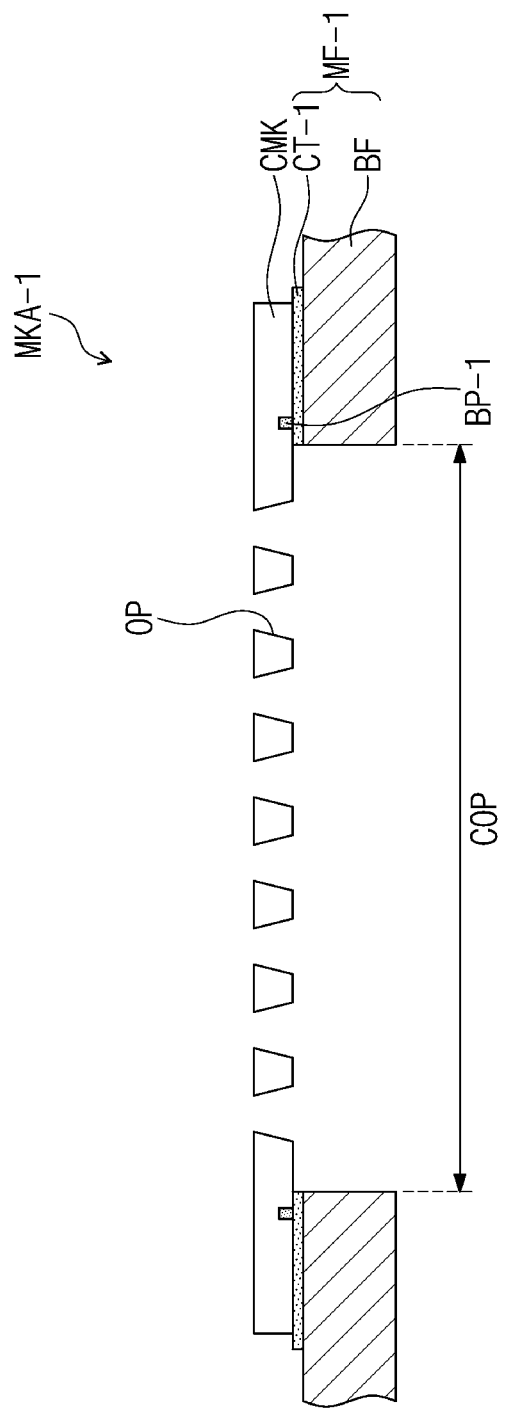

Thereafter, as illustrated in FIG. 7B, a joining part BP-1, which joins the cell mask CMK and the mask frame MF-1, is formed. The joining part BP-1 may be formed, as illustrated in FIGS. 6C and 6D, through the bonding machine DV1 (see FIG. 6C), and may join the cell mask CMK and the coating part CT-1 together.

Figure 7C:
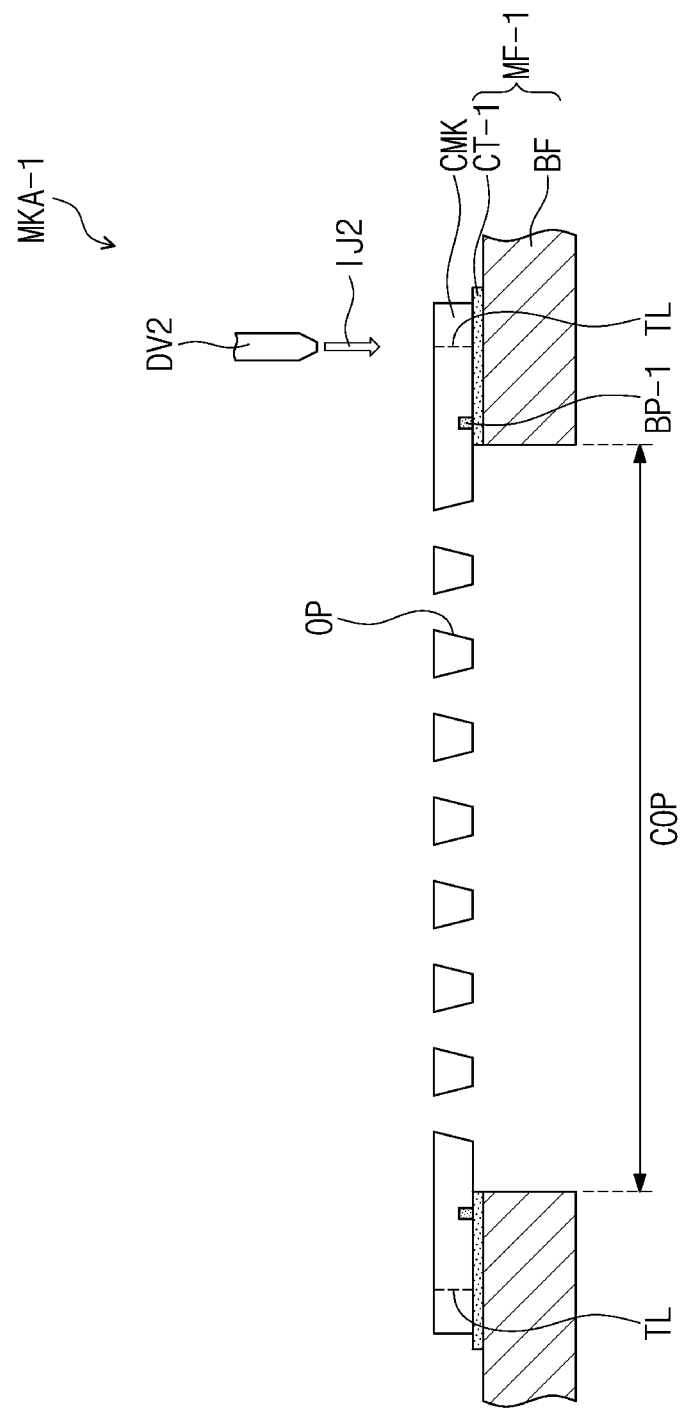

Afterwards, as illustrated in FIGS. 7C and 7D, a mask MK-1 is formed by providing a trimmer DV2 over the mask assembly MKA-1. The trimmer DV2 may cut a portion of the cell mask CMK along a trimming line TL defined on the cell mask CMK, and a unit mask CMK-a may be formed.

In some embodiments, the mask frame MF-1 may correspond to the mask frame MF-1 illustrated in FIG. 5B. The coating part CT-1 may have a shape that covers a portion of the base part BF and that exposes another portion of the base part BF. The joining line BL or the trimming line TL may be defined on a region overlapping the coating part CT-1. The joining part BP-1 and the edge EG may be formed on the coating part CT-1.

According to the present disclosure, because the coating part CT-1 is selectively formed in a region irradiated with the first beam IJ1 (see FIG. 6C) or the second beam IJ2, it is possible to prevent the coating part CT-1 from being formed in an unnecessary region. Accordingly, process costs may be reduced.

FIGS. 8A to 8D are cross-sections illustrating a mask manufacturing method according to some embodiments of the present disclosure. FIGS. 8A to 8D illustrate processes corresponding to FIGS. 7A to 7D, respectively. Hereinafter, the present disclosure will be described with reference to FIGS. 8A to 8D. Meanwhile, like reference numerals are given to like elements as those described in FIGS. 1 to 6F, and duplicate descriptions thereof will be omitted herein.

Figure 8A:
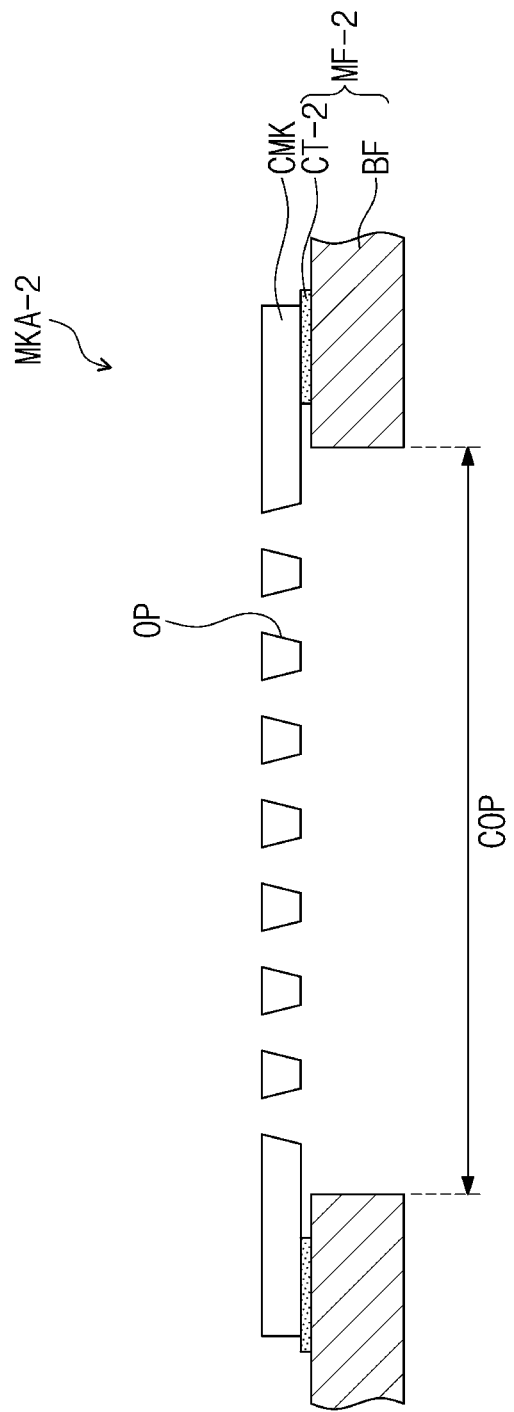
FIGS. 8A to 8D are cross-sectional views illustrating a mask manufacturing method according to some embodiments of the present disclosure.
Figure 8B:
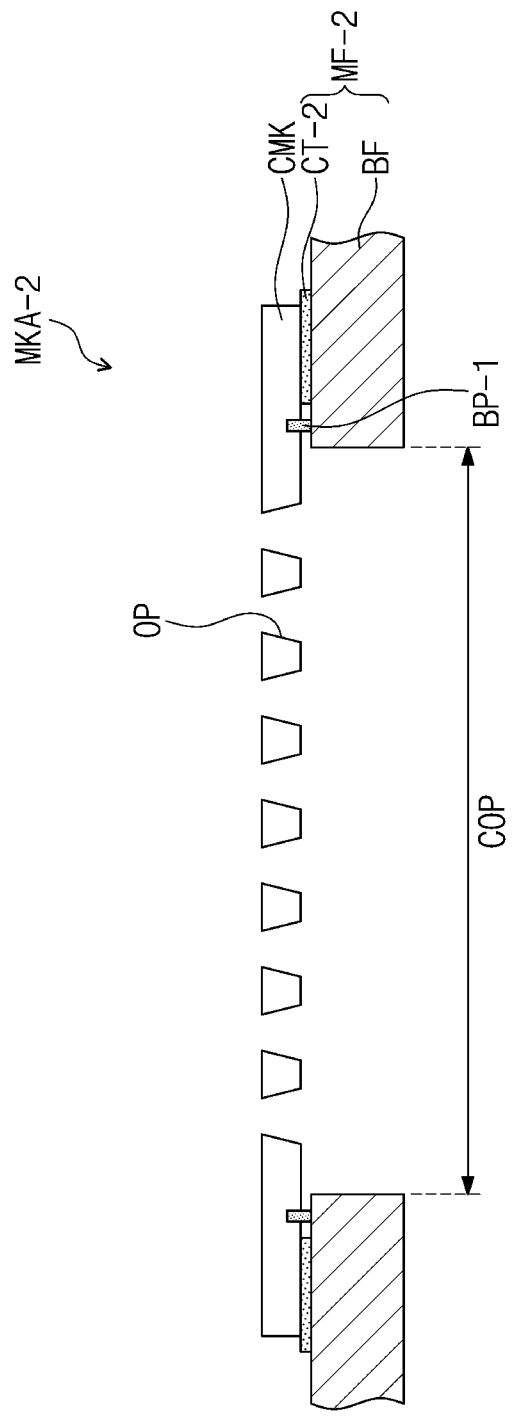

As illustrated in FIG. 8A, a mask assembly MKA-2 may include a mask frame MF-2, and a cell mask CMK. The mask frame MF-2 may correspond to the mask frame MF-2 illustrated in FIG. 5C. Thereafter, as illustrated in FIG. 8B, a joining part BP-1, which joins the cell mask CMK and the mask frame MF-2, is formed. The joining part BP-1 may be formed, as illustrated in FIGS. 6C and 6D, through a bonding machine DV1 (see FIG. 6C).

In some embodiments, the coating part CT-2 may be spaced apart from the joining part BP-1 on a plane. The joining line BL (see FIG. 6C) is defined in a region that does not overlap the coating part CT-2 on a plane. Accordingly, the joining part BP-1 may join the cell mask CMK and the base part BF.

Figure 8C:
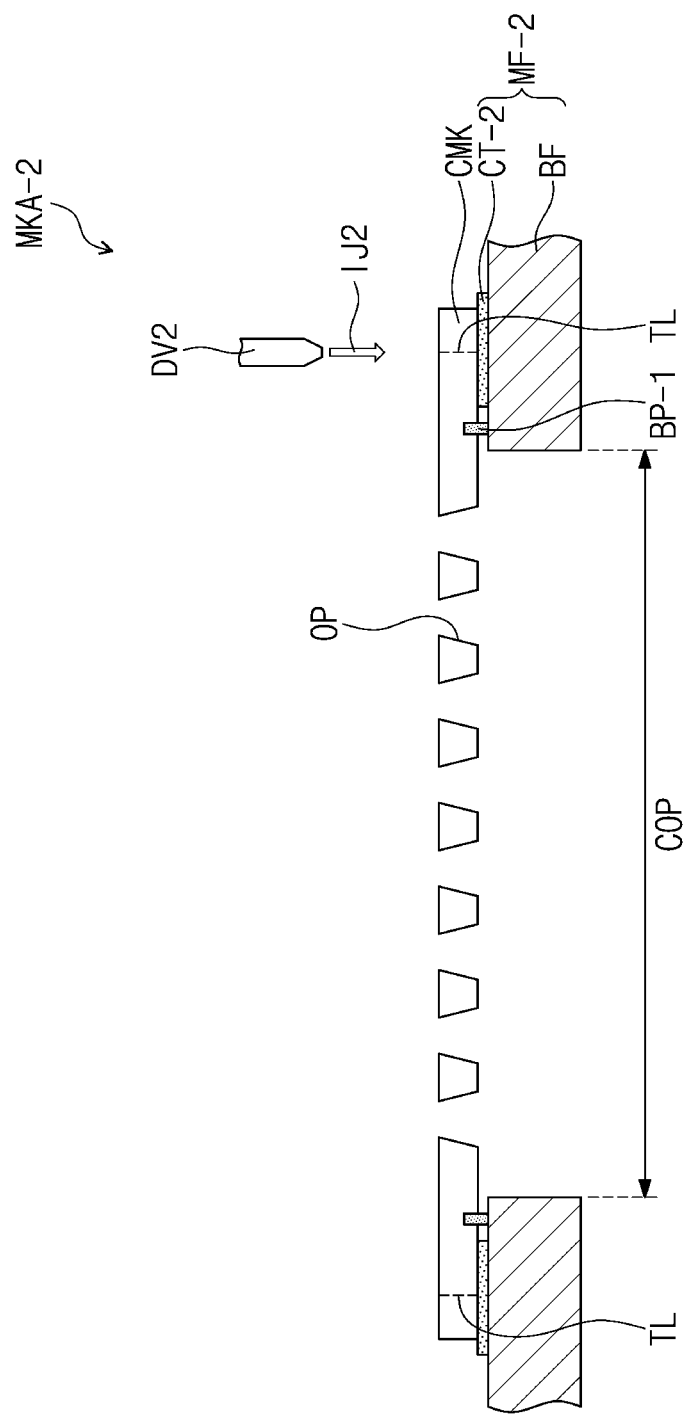
Figure 8D:
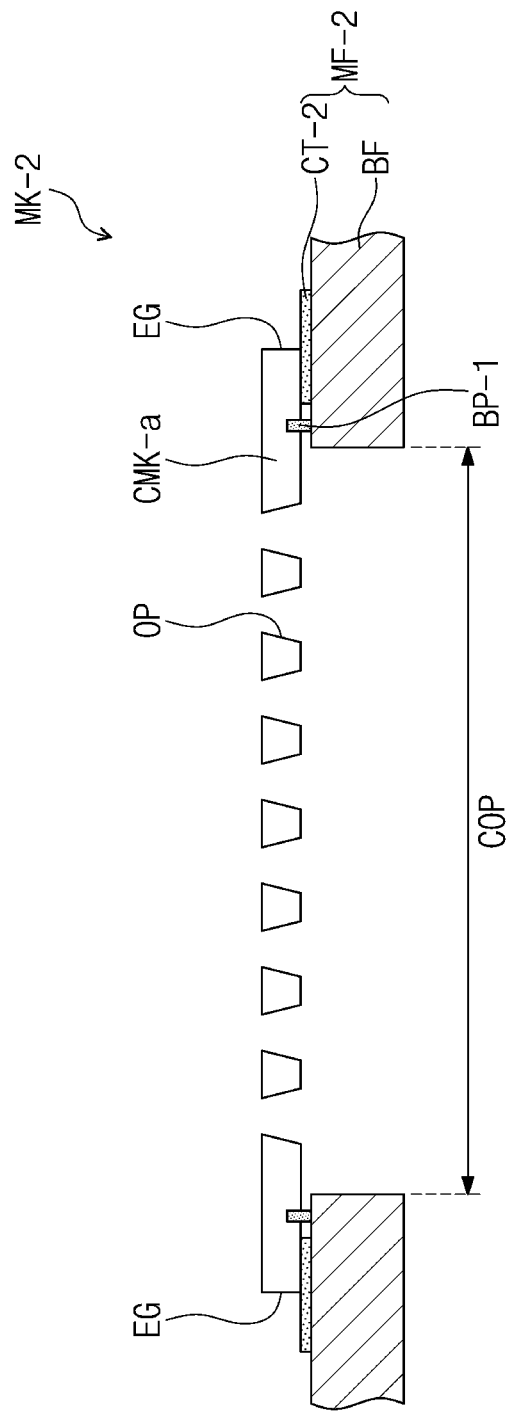

Then, as illustrated in FIGS. 8C and 8D, the mask MK-2 is formed by providing a trimmer DV2 over the mask assembly MKA-2. The trimmer DV2 may cut a portion of the cell mask CMK along the trimming line TL defined on the cell mask CMK, thereby forming form a unit mask CMK-a.

The coating part CT-2 may be formed at a position which does not overlap the joining part BP-1 and overlaps the edge EG. The joining part BP-1 is formed by melting a portion of the cell mask CMK or the base part BF, and therefore, even if a portion of the base part BF is damaged, the damaged degree may fall within an acceptable tolerance range. However, as trimming by the trimmer DV2 is a process for selectively removing only the cell mask CMK, it is desirable that the base part BF is not damaged by the second beam IJ2. According to the present disclosure, because the coating part CT-2 is formed selectively in a region that is irradiated with the second beam IJ2, the coating part CT-2 may be selectively formed only in a suitable region (e.g., not in an unnecessary region). Accordingly, process costs may be reduced.

According to the present disclosure, processing reliability may be improved in a process for manufacturing a mask.

In the above, description has been made with reference to embodiments of the present disclosure, but those skilled in the art or those of ordinary skill in the relevant technical field may understand that various modifications and changes may be made to the present disclosure within the scope of, and not departing from the spirit and the technology scope of, the present disclosure described in the claims to be described later.

Therefore, the technical scope of the present disclosure is not limited to the contents described in the detailed description of the specification, but should be determined by the claims, with functional equivalents thereof to be included therein.

What is claimed is:

1. A mask comprising:
   a mask frame comprising a base part in which cell openings are defined, and a coating part surrounding edges of the cell openings, covering at least a portion of an upper surface of the base part, and comprising a material composition that is different from that of the base part; and
   unit masks on the mask frame, respectively corresponding to the cell openings, comprising a material composition that is different from that of the coating part, and in which openings are defined.

2. The mask of claim 1, wherein an absorption rate of the coating part for a laser is lower than an absorption rate of the base part for the laser.

3. The mask of claim 2, wherein the coating part comprises magnesium or aluminum.

4. The mask of claim 1, wherein a thickness of the coating part is at most about 1/20 of a thickness of the base part.

5. The mask of claim 1, wherein the coating part covers an entirety of the upper surface of the base part.

6. The mask of claim 1, wherein the coating part comprises a plurality of coating parts spaced apart from each other, and respectively surrounding the cell openings.

7. The mask of claim 1, wherein edges of each of the unit masks overlaps the coating part on a plane.

8. The mask of claim 1, further comprising a joining part joining one of the unit masks and the mask frame.

9. The mask of claim 8, wherein the joining part joins the one of the unit masks and the coating part.

10. The mask of claim 8, wherein the joining part joins the one of the unit masks and the base part, and wherein the coating part is spaced apart from the joining part.

* * * * *